United States Patent
Platzgummer

(10) Patent No.: US 7,368,738 B2
(45) Date of Patent: May 6, 2008

(54) ADVANCED PATTERN DEFINITION FOR PARTICLE-BEAM EXPOSURE

(75) Inventor: Elmar Platzgummer, Vienna (AT)

(73) Assignee: Carl Zeiss SMS GmbH, Jena (DE)

( * ) Notice: Subject to any disclaimer, the term of this patent is extended or adjusted under 35 U.S.C. 154(b) by 318 days.

(21) Appl. No.: 11/119,514

(22) Filed: Apr. 29, 2005

(65) Prior Publication Data

US 2005/0242303 A1 Nov. 3, 2005

(30) Foreign Application Priority Data

Apr. 30, 2004 (AT) .............................. A 755/2004

(51) Int. Cl.
*G21K 1/087* (2006.01)
(52) U.S. Cl. .............................. 250/492.23; 250/492.1; 250/492.22; 250/492.3; 250/398
(58) Field of Classification Search ............. 250/492.1, 250/492.22, 492.23, 492.3, 398
See application file for complete search history.

(56) References Cited

U.S. PATENT DOCUMENTS

| | | | |
|---|---|---|---|
| 4,985,635 A | | 1/1991 | Inokuti et al. |
| 5,260,579 A | | 11/1993 | Yasuda et al. |
| 5,359,202 A | | 10/1994 | Yasuda et al. |
| 5,369,282 A | * | 11/1994 | Arai et al. ............. 250/492.22 |
| 5,801,388 A | | 9/1998 | Stengl et al. |
| 6,326,632 B1 | | 12/2001 | Buschbeck et al. |
| 6,486,479 B1 | * | 11/2002 | Oae et al. ................. 250/492.2 |
| 6,768,125 B2 | * | 7/2004 | Platzgummer et al. . 250/492.22 |
| 7,084,411 B2 | * | 8/2006 | Lammer-Pachlinger et al. . 250/492.1 |
| 2003/0155534 A1 | * | 8/2003 | Platzgummer et al. . 250/492.22 |
| 2005/0087701 A1 | | 4/2005 | Lammer-Pachlinger et al. |

OTHER PUBLICATIONS

I.L. Berry et al., Programmable Aperture Plate for Maskless High-Throughput Nanolithography, J. Vac. Sci. Technol. B 15 (1997), pp. 2382-2386, US.
M. Muraki et al., New Concept for High-Throughput Multielectron Beam Direct Wire System, J. Vac. Sci. Technol. B 18(6), pp. 3061-3066, US, 2000.

\* cited by examiner

*Primary Examiner*—Robert Kim
*Assistant Examiner*—Michael Maskell
(74) *Attorney, Agent, or Firm*—Jones Day

(57) ABSTRACT

In a pattern definition device for use in a particle-beam exposure apparatus a plurality of blanking openings (910) are arranged within a pattern definition field (bf) composed of a plurality of staggered lines (bl) of blanking openings, each provided with a deflection means controllable by a blanking signal (911); for the lines of blanking openings, according to a partition of the blanking openings of a line into several groups (g4,g5,g6), the deflection means of the blanking openings of each group are fed a common group blanking signal (911), and the group blanking signal of each group of a line is fed to the blanking means and connected to the respective blanking openings independently of the group blanking signals of the other groups of the same line.

33 Claims, 21 Drawing Sheets

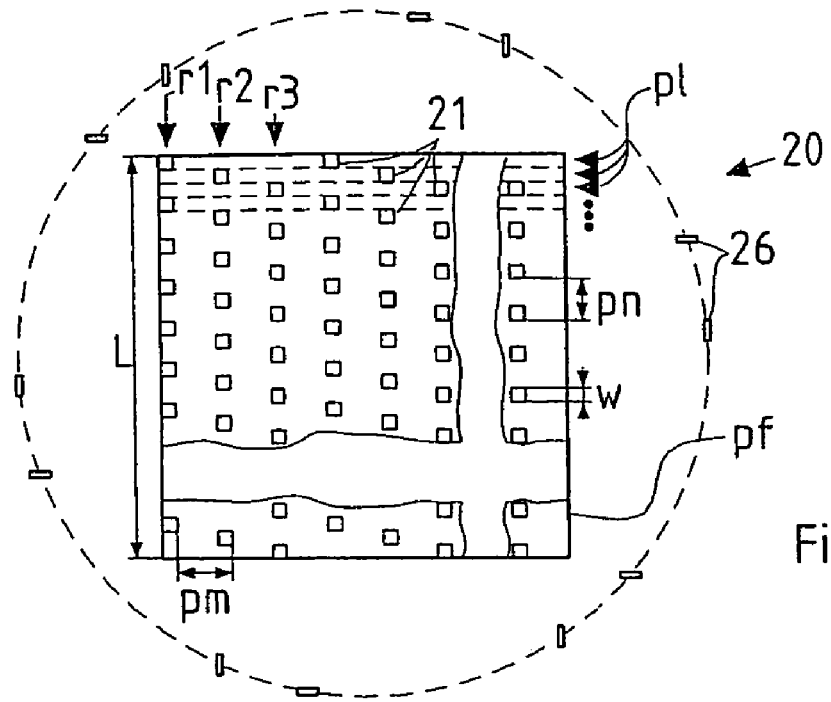
Fig. 2
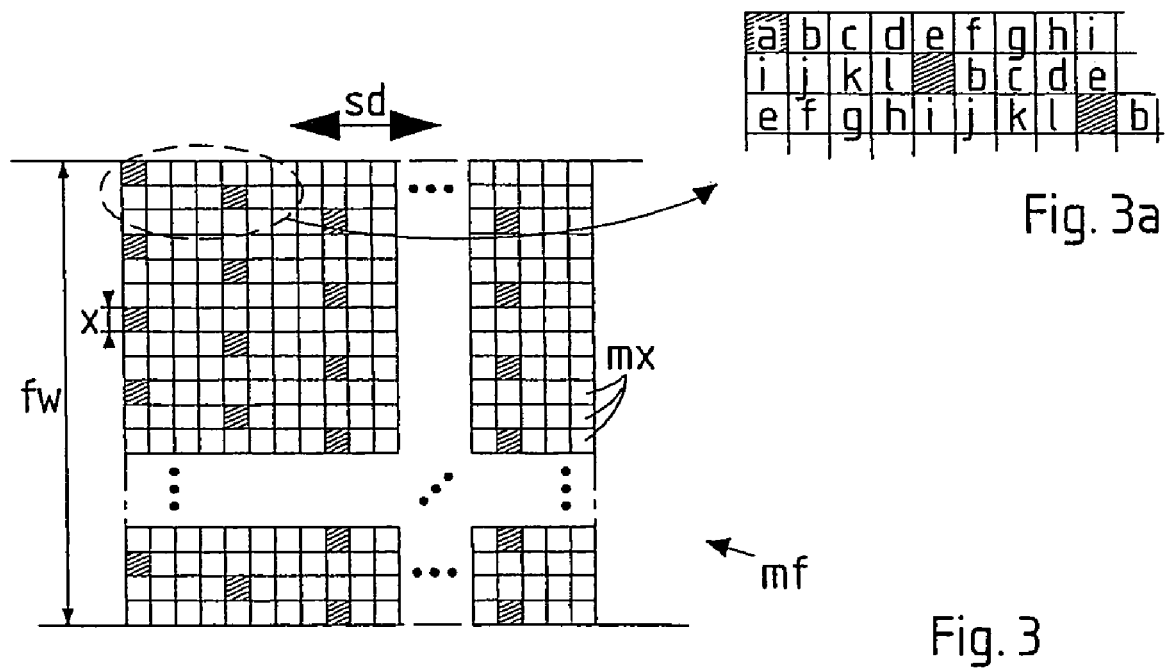
Fig. 3a
Fig. 3

Grid position: 13
Line position: 0,5 nm
Gray level: 0,3,14,13,13,3,0
Average dose: 2.68
Cut off dose: 1.3

Grid position: 1
Line position: 12,5 nm
Gray levels: 0,11,15,11,0,0,0
Average dose: 2.68
Cut off dose: 1.3

Grid position: 6
Line position: 7,5 nm
Gray level: 0,5,15,15,3,0,0
Average dose: 2.68
Cut off dose: 1.3

Grid position: 13
Line position: 0,5 nm
Gray level: 0,0,12,15,10,0,0
Average dose: 2.68
Cut off dose: 1.3

Grid position: 6
Line position: 7,5 nm
Gray level: 20, 43, 0
Average dose: 1.79
Cut off dose: 0.9

ADVANCED PATTERN DEFINITION FOR PARTICLE-BEAM EXPOSURE

CROSS-REFERENCE TO RELATED APPLICATIONS

This application claims the benefit of Austrian Patent Application Serial No. A 755/2004, filed 30 Apr. 2004.

FIELD OF THE INVENTION AND DESCRIPTION OF PRIOR ART

The invention relates to improvements of a multi-beam pattern definition device for use in a particle-beam exposure apparatus.

More in detail, the invention relates to a pattern definition device for use in a particle-beam exposure apparatus, which device is adapted to be irradiated with a beam of electrically charged particles and let pass the beam only through a plurality of apertures which are of identical shape and define the shape of beamlets permeating them; the apertures are arranged within a pattern definition field composed of a plurality of staggered lines of apertures; the apertures are spaced apart within said lines by a first integer multiple of the width of an aperture and are offset between neighboring lines by a fraction of said integer multiple width; with said apertures are associated corresponding blanking openings arranged in lines of blanking openings; each blanking opening is provided with a deflection means controllable by a blanking signal between two deflection states, namely, a first state ('switched on') when the deflection means has assumed a state in which particles radiated through the opening are allowed to travel along a desired path, and a second state ('switched off') when the deflection means is deflecting particles radiated through the opening off said path.

In other words, the particle beam is generated by an illumination system, and it illuminates a pattern definition (PD) means having an array of apertures which can be controlled so as to allow ('switch on') or effectively deactivate ('switch off') the passage of particles of the beam through the respective apertures. The beam permeating the aperture array (or more exactly, through the switched-on apertures of the array) forms a patterned particle beam bearing a pattern information as represented by the spatial arrangement of the apertures. The patterned beam is then projected by means of a particle-optical projection system onto the substrate where an image of the apertures is thus formed.

One important application of exposure apparatus of this kind is in the field of nano-scale patterning, by direct ion beam material modification or ion beam induced etching and/or deposition, used for the fabrication or functionalization of nano-scale devices, particularly having sub-100 nm feature sizes. Another important application of exposure apparatus of this kind is in the field of particle-beam lithography used in semiconductor technology, as a lithography apparatus. In order to define a desired pattern on a substrate surface, such as a circuit layer to be defined on a silicon wafer, the wafer is covered with a layer of a radiation-sensitive photoresist. Then the desired structure is imaged onto the photoresist by means of a lithography apparatus. The photoresist thus patterned is partially removed according to the pattern defined by the previous exposure step, and is now used as a mask for further structuring processes such as etching. By repeating this scheme, complicated minute structures such as an integrated circuits can be formed.

The potential use of an addressable aperture plate for direct pattern transfer by charged particle beam projection has been investigated since more than a decade. One early discussion is given by B. Lischke et al., Microelectronic Engineering 9, 1989, pp. 199-203. Later, in 1997, I. L. Berry et al., in J. Vac. Sci. Technol. B, 15 (6), 1997, pp. 2382-2386, presented a writing strategy based on a blanking aperture array and an ion projection system.

Arai et al., U.S. Pat. No. 5,369,282, discuss an electron-beam exposure system using a so-called blanking aperture array (BAA) which plays the role of the PD means. The BAA carries a number of rows of apertures, and the images of the apertures are scanned over the surface of the substrate in a controlled continuous motion whose direction is perpendicular to the aperture rows. The rows are aligned with respect to each other in an interlacing manner so that the apertures form staggered lines as seen along the scanning direction. Thus, the staggered lines sweep continuous lines on the substrate surface without leaving gaps between them as they move relative to the substrate, thus covering the total area to be exposed on the substrate. In the U.S. Pat. No. 5,369,282, the apertures of every second row align and the pitch between neighboring apertures in a row is twice the width of an aperture; in general, an alignment of rows is possible based on any number n, the pitch then being n times the width of an aperture. Yasuda et al., U.S. Pat. No. 5,359,202 and U.S. Pat. No. 5,260,579 use a similar BAA for exposing a substrate with a pattern, but the need to fed control lines to each of the blanking apertures makes the internal structuring very complex and prone to unwanted disturbing effects such as cross-talking and transit time delays.

The article of I. L. Berry et al. in J. Vac. Sci. Technol. B 15 (1997) pp. 2382-2386, describes a PD device comprising a "programmable aperture array" with an array of 3000×3000 apertures of 5 µm side length with an n=4 alignment of rows and staggered lines. The aperture array contains additional logic circuitry, thus implementing an electronic mask scanning system in which the pattern information is passed by means of shift registers from one aperture to the next within a row. The article proposes to use a 200× demagnification ion-optical system for imaging the apertures of the BAA onto the substrate.

Starting from Berry's concept, E. Platzgummer et al., in the US-2003-0155534-A1 (=GB 2 389 454 A), presented a multi-beam direct write concept, dubbed PML2 (short for "Projection Mask-Less Lithography #2"), employing a PD device comprising a number of plates stacked on top of the other, among them an aperture array means (aperture plate) and a blanking means (blanking plate). These separate plates are mounted together at defined distances, for instance in a casing. The aperture array means has a plurality of apertures of identical shape defining the shape of beamlets permeating said apertures, wherein the apertures are arranged within a PD field composed of a plurality of staggered lines of apertures, wherein the apertures are spaced apart within said lines by a first integer multiple of the width of an aperture and are offset between neighboring lines by a fraction of said integer multiple width. The blanking means has a plurality of blanking openings arranged in an arrangement corresponding to the apertures of the aperture array means, in particular having corresponding staggered lines of blanking openings. The teaching of the US-2003-0155534-A1 with regard to the architecture and operation of the PD device, and in particular the architecture of its blanking plate, are hereby included as part of this disclosure.

According to the PML2 concept, the substrate is moved continuously along a straight path over each die field; additional scanning of the beam orthogonally to the scanning direction is not necessary (except, where needed, to compensate for lateral travel motion errors of the scanning stage). Furthermore, gray scales can be generated by subsequent exposures of apertures located in line, so that a shift register approach can be effectively applied to create gray scale patterns (of a predetermined bit size, e.g. 5 or more bits) while only the substrate is moved. The PML2 concept involves the use of a large amount of memory on the aperture plate, located next to the apertures either in between or in the vicinity. A main distinctive feature of the PML2 over prior art is a row offset between blocks of regular apertures on the aperture plate, intended for the placement of shift register electronic circuits on the blanking plate.

The key for the realization of an addressable mask is the so-called Micro-Electro and micro-Mechanical System (MEMS) technology, which allows the monolithic fabrication of hundred thousands up to millions of apertures together with the electronics needed to control the beam switching and data management. Since the minimum feature size of industrial MEMS devices is about 100 to 200 times larger than the typical critical dimension in lithography (for example the size of apertures and micro-deflectors), a powerful large field high resolution optical projection system is obligatory for exploitation of the advanced MEMS fabrication technologies in the field fast writing applications, such as for example mask-less lithography.

The main advantage of the multi-beam approach inherent to the PLM2 is the vast enhancement of the writing speed compared to single beam writers, due to the fact that the charged particle beam comprises a plurality of sub-beams, dynamically structured by an aperture plate including switchable blanker devices. The improved productivity (over other prior art, such as Arai et al. and Yasuda et al.) arises mainly from the following features:

- the possible number of sub-beams directed parallel to the substrate and the possible density of apertures per area is significantly increased, resulting in relaxed requirements for the particle source;
- single beam blanking is achieved by a continuous data stream and a simplified data line architecture, where only one aperture row (=number of lines×one aperture) is to be fed into the PD field per clock cycle, the signal traveling by shift registers over the PD field;
- the influence of space charge is reduced since the beam current is distributed over a large cross section as a consequence of using a broad beam;
- a high degree of redundancy is produced using a large number of fractional exposures (apertures in line) to cumulate the desired exposure dose, which permits a gray scale generation during single pass scanning.

However, with the PLM2 layout, as the same for other prior art, the following main problems arise:

- using the physical address grid available by the BAA of prior art, in particular Arai et al. and Berry et al., only an insufficient number of gray scale levels is achieved in single pass exposures in order to fulfill lithographic requirements (1 nm address grid for 45 nm node), as the size of the PD field is limited in large field projection systems. The consequences are a poor process latitude, untolerable values for the line edge roughness, which is related to the physical address grid, and insufficient pattern placement accuracy, or in case of a multi pass strategy, reduced throughput and unwanted alignment errors.
- the need for a distortion-free imaging of a large pattern field as a consequence to the requirement to bring thousands of apertures in overlay during the scanning process (to exploit the high redundancy); and
- dealing with an unavoidable current dependent (=pattern dependent) image distortion and de-focusing, limiting the usable current and requiring pattern homogenization, which will involve a time consuming data pre-processing.

SUMMARY OF THE INVENTION

In view of the above, it is the task of the present invention to find a way to overcome the deficiencies of prior art and allow the use of an addressable mask for applications such as mask-less lithography or nano-scale beam patterning applications. A central aim is to simplify the circuitry needed in the blanking plate of the PD device and allow for a higher number of apertures present, and allow a more flexible control of groups of apertures. Furthermore, it shall allow the exposure of pixels at the target according to a gray scale, i.e. with exposure levels interpolated between a minimal ('black') and maximal ('white') exposure dose. Moreover, the invention is aimed at realizing a finer address grid and reducing the line edge roughness despite an unchanged or even reduced number of apertures compared to prior art.

This task is solved by a PD device as described in the beginning wherein for the lines of blanking openings, the blanking openings of the line are partitioned into several groups and the deflection means of the blanking openings of each group are fed a common group blanking signal; the group blanking signal of each group of a line is fed to the blanking means and connected to the respective blanking openings independently of the group blanking signals of the other groups of the same line.

The basic idea of the invention as a distinct improvement over the basic PML2 is an improved writing strategy of gray scales, related to the establishment of groups of apertures which, with respect to whether they are switched on or off, are directly controlled by the bits of the controlling signal fed into the blanking plate. Thus, by grouping a number of apertures (at least two) the total number of controlling signals, and consequently of feeding lines which have to be provided in the PD device, can be kept at a very low level. The openings within a group are controlled by the same controlling signal, namely the respective group blanking signal, which is conveniently propagated from one opening of the group to the next by time delay means, such as shift registers as proposed in the basic layouts of Berry et al. or intermediate storage means as in the US-2003-0155534-A1.

Thus, the invention offers a distinctly improved writing strategy of gray scales combined with an improved data path and data preparation, resulting in significant advantages with respect to physical realization, performance and risk issues of the PD device. The main advantage is that it dispenses with the need for highly integrated circuits for memory and data management in the area inside or in between the blanking openings for the implementation of gray shades. As will be shown below, this approach reduces major technical challenges such as the space requirement for the memory and thermal heating issues, while at the same time an increased degree of void ratio (i.e. productivity) and redundancy is offered. Another important advantage of the invention is that it enables the use of additional groups of "interpolating pixels" with individual controlling signals to realize a finer physical address grid, in the following referred as "interlocking grid", where the total number of apertures on the PD device, and thus the required size of the PD field, can be reduced. The possibility to realize a small illuminating beam diameter with a small PD field is of great importance if there are limitations with respect to the outer diameter of the charged particle optical column. Generally, the possibilities to apply the PML2 concept for lithography but also nano-scale beam patterning are broadly extended by making the PML2 scanning stripe approach applicable for optical systems with smaller diameter and a reduced complexity.

Furthermore, the invention enables a downscaling of the lithographic node, for example from 45 nm to 32 nm lines and spaces resolution, without simultaneously downscaling the critical dimensions in the PD device. Hence, the invention helps to circumvent the feature size limitation of state-of-the-art MEMS technology. All together, the invention allows to significantly reduce the diameter of the optical beam and the required PD device in PML2 with the purpose to relax optical performance requirements, such as for example the absence of distortion, and to improve productivity by using several columns in parallel.

In a preferred embodiment of the invention, the groups have at least two different sizes with regard to the numbers of blanking openings in the respective groups. In particular, in order to realize a regular gray scale (equidistant gray values) in a simple manner, the numbers of blanking openings in the groups may correspond to powers of two multiplied with a uniform base number. In a variant, the numbers in all groups except one group may correspond to powers of two multiplied with a uniform base number; that one group then has another number of openings, which may be defined by the remaining place on the pattern definition field, or an often-used gray value, or the like. Preferably, the number of all groups in a line is smaller than 16 and the size of the largest group with regard to the respective number of blanking openings is at least four times the size of the smallest group.

To simplify the data processing of the gray values to the set of blanking group signals, it is advantageous if the partition of blanking openings into groups is the same for all lines. In general, the presence of same partitioning does not mean that the groups of same size are also at corresponding places in the different lines, so different sequences of the groups within the respective lines may be present. Of course, a simpler arrangement is obtained if the corresponding groups of all lines are positioned adjacent to each other, thus forming stripes spanning perpendicular to the orientation of lines over the PD field.

In a further development of the invention, while the apertures of a group always run along a straight line, the aperture of different group may run along partially overlapping lines. While this arrangement may, at first sight, seem to complicate the processing of patterns, in fact it allows to emulate finer resolution of features in the pattern to be exposed. Thus, the PD field may be divided perpendicular to the orientation of lines into at least two domains, each domain being composed of a plurality of staggered lines of blanking openings, wherein the lines of one domain are offset to the lines of the next domain by a fraction of the width of the lines, the apertures of each line of each domain representing at least one group. In the case of two domains, wherein the lines of the second domain are offset to the lines of the first domain by a fraction of the width of the lines, each group of the first domain may preferably have a corresponding group of the second domain with equal number of blanking openings in the respective group, in order to allow a symmetrical treatment of the gray scales for the both domains.

As already mentioned above, the blanking signal may be applied to the individual blanking openings through time delay means realizing a time delay of said signal corresponding to the offsets of the respective blanking openings along the line.

Preferably, the width of the apertures is equal to the width of the lines, in particular when square-shaped or rectangular apertures are used. In a variant, however, the width of the apertures associated with selected groups of blanking openings may have a width smaller than the width of the lines, the remaining apertures having a width equal to the width of the lines. Also this measure can be used to emulate a finer resolution of the exposed pattern.

In a preferred embodiment of the invention the group blanking signals are fed to the PD field partly at a side running parallel to the orientation of lines, partly at a side running perpendicular. This further reduces the density of lines at the feeding sites.

In a suitable realization of the aperture arrangement, the shape of the apertures is substantially equivalent to a two-dimensional geometrical base shape of a contiguous covering of the plane, such as a square or a regular hexagon. The advantage of a contiguous covering arrangement is that the influence of the optical imaging blur on the dose distribution on the wafer (=aerial image), in particular on the gray levels needed for a specific feature, is as small as possible, so that an intrinsic radial variation of the optical imaging blur inside the projected image of the PD device can be tolerated. If the blur is in the range of the spot size, the same advantage can be achieved by choosing the area of the apertures substantially equivalent to a two-dimensional geometrical base shape of a contiguous covering of the plane, whereas the shape may differ from that of a contiguous covering, in particular by modifying the edges of a polygonal base shape such as rounding the edges or beveling (canting). The total shape should be enlarged, if necessary, so the total area of the modified shape is kept, and the area of the shape of the apertures is the same as that of the original polygonal base shape. This means, for example, that instead of perfectly square-shaped apertures it is possible to use corner-rounded square shaped apertures with equal area. The latter allows higher tolerances in the fabrication process. In general, a hexagonal arrangement has the advantage that it has the highest possible density of pixels per area combined with the highest degree of symmetry, both improving the achievable line placement precision and line edge roughness at limited number of apertures in the PD means (=limited size of the PD field).

In order to have a reservoir of 'extra' openings which can be accessed when needed, in particular if one or more other blanking openings are found to be defect, additional blanking openings may be provided which are activated or deactivated for operation. The activation/deactivation can, for instance, be done by a structuring step such as irradiation by focused ion, electron or laser beam. Thus, a group may comprise at least one blanking opening for which the line feeding the group blanking signal to said blanking opening (s) comprises a component which is accessible on a surface of the device by a structural modification and which is adapted to change its transmissivity for the group blanking signal between an electrically connecting state and a blocking state upon treatment by said structural modification. In particular, the component may be realized as a conductor segment adapted to be modified, possibly irreversibly, between an electrical well-conducting and a non-conducting state.

Preferably, the blanking is done by a small change to the angle of the beamlet which is deflected only so far that it does not reach the target or any of the devices at the target position. To this end, the deflection means may be adapted to deflect, in the switched off state, the particles to an absorbing surface of the exposure apparatus mounted after the PD device as seen in the direction of the particle beam.

BRIEF DESCRIPTION OF THE DRAWINGS

In the following, the present invention is described in more detail with reference to the drawings, which show:

FIG. 2 a plan view of one possible aperture arrangement in a PD device of the lithography apparatus of FIG. 1;

FIG. 3 an image field as present on a substrate surface with the aperture arrangement of FIG. 2;

FIGS. 9a and 9b the arrangement of the gray groups in a detail of FIG. 8, wherein FIG. 9a shows a single line while FIG. 9b shows a set of neighboring lines;

DETAILED DESCRIPTION OF THE INVENTION

Pattern Definition System

The preferred embodiments of the invention discussed in the following are based on the pattern definition (PD) system disclosed in the US-2003-0155534-A1. In the following, the technical background of the PD system, as far as relevant to the invention, is first discussed with reference to FIGS. 1 to 5 (which correspond, with modifications where appropriate, those of the US-2003-0155534-A1), then embodiments of the invention in the PD system are discussed. It should be appreciated that the invention is not restricted to the following embodiments, which merely represent some of the possible implementations of the invention.

Figure 1:
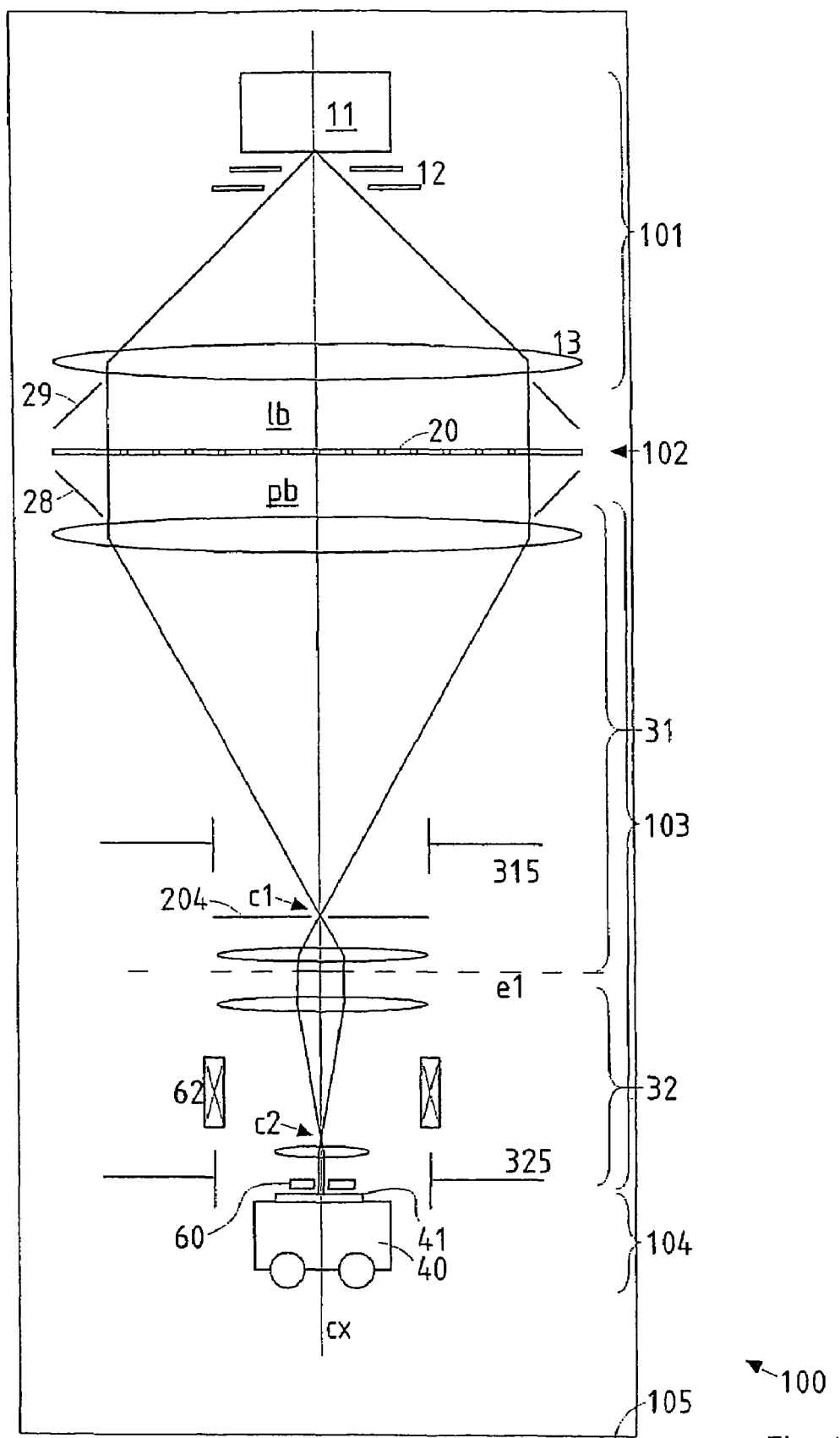
FIG. 1 in a longitudinal section a layout of a lithography apparatus to which the invention applies.

An overview of a lithographic apparatus employing the preferred embodiment of the invention is shown in FIG. 1. In the following, only those details are given as needed to disclose the invention; for the sake of clarity, the components are not shown to size in FIG. 1. The main components of the lithography apparatus 100 are—corresponding to the direction of the lithography beam lb, pb which in this example runs vertically downward in FIG. 1—an illumination system 101, a PD system 102, a projecting system 103, and a target station 104 with the substrate 41. The whole apparatus 100 is contained in a vacuum housing 105 held at high vacuum to ensure an unimpeded propagation of the beam lb, pb along the optical axis cx of the apparatus. The particle-optical systems 101, 103 are realized using electrostatic or electromagnetic lenses.

The illumination system comprises, for instance, an electron gun 11, an extraction system 12 as well as a condenser lens system 13. It should, however, be noted that in place of electrons, in general, other electrically charged particles can be used as well. Apart from electrons these can be, for instance, hydrogen ions, heavier ions, charged molecules or clusters, the choice of projectile depending on the desired beam-substrate interaction.

The extraction system 12 accelerates the particles to a defined energy of typically several keV, e.g. 10 keV. By means of a condenser lens system 13, the particles emitted from the source 11 are formed into a wide, substantially telecentric particle beam serving as lithography beam lb. The lithography beam lb then irradiates a PD device 20 which, together with the devices needed to keep its position, form the PD system 102. The PD device 20 is held at a specific position in the path of the lithography beam lb, which thus irradiates a plurality of apertures 21 (see FIG. 2). Some of the apertures are "switched on" or "open" so as to be transparent to the incident beam in the sense that they allow the portion of the beam (beamlet) that is transmitted through it to reach the target; the other apertures are "switched off" or "closed", i.e. the corresponding beamlets cannot reach the target, and thus these apertures are effectively non-transparent (opaque) to the beam. The pattern of switched-on apertures is chosen according to the pattern to be exposed on the substrate, as these apertures are the only portions of the PD device transparent to the beam lb, which is thus formed into a patterned beam pb emerging from the apertures (in FIG. 1, below the device 20). The temperature distribution over the PD device 20 is kept stable by appropriate heating or cooling elements, with optional means 28, 29 for irradiation cooling in addition to thermally conductive cooling.

The pattern as represented by the patterned beam pb is then projected by means of an electro-magneto-optical or purely electro-optical projection system 103 onto the substrate 41 where it forms an image of the switched-on mask apertures 21. The projection system 103 implements a demagnification of, for instance, 200× with two crossovers c1, c2. The substrate 41 is, for instance, a silicon wafer covered with a photo-resist layer. The wafer 41 is held and positioned by a wafer stage 40 of the target station 104.

The apparatus 100 may further comprise an alignment system 60, which allows to stabilize the position of the image of the mask apertures (image field mf, FIG. 3) on the substrate with respect to the particle-optical system by means of reference beams which are formed in the PD system by reference marks 26 at the side of the PD field pf (FIG. 2); the principles of an alignment system are described in the U.S. Pat. No. 4,967,088. For instance, correction of image position and distortion can be done by means of a multipole electrode 315, 325; additionally, a magnetic coil 62 can be used to generate a rotation of the pattern in the substrate plane.

In the embodiment of the invention shown in FIG. 1, the projection system 103 is composed of two consecutive electro-magneto-optical projector stages 31, 32. The lenses used to realize the projectors 31, 32 are shown in FIG. 1 in symbolic form only, as technical realizations of particle imaging systems are well known in the prior art, such as, for instance, the U.S. Pat. No. 4,985,634 (=EP 0 344 646) of the applicant. The first projector stage 31 images the plane of the apertures of the device 20 into an intermediate plane e1 which in turn is imaged onto the substrate surface by means of the second projector stage 32. Both stages 31, 32 employ a demagnifying imaging through crossovers c1, c2. The demagnification factor for both stages is chosen such that an overall demagnification of several hundred results, e.g. 200×. A demagnification of this order is in particular suitable with a lithography setup, in order to alleviate problems of miniaturization in the PD device. A stop plate 204 is provided at, for instance, the position of a crossover c1, in order to block out beam components which are deflected off the regular beam path.

In both projector stages the respective lens system is well compensated with respect to chromatic and geometric aberrations; furthermore, a residual chromatic aberration of the first stage 31 can be compensated by suitable fine correction of the electrode potentials in the second stage 32.

As a means to shift the image laterally as a whole, i.e. along a direction perpendicular to the optical axis cx, deflection means 315, 325 are provided in one or both of the projector stages. The deflection means can be realized as, for instance, a multipole electrode system which is either positioned near to the crossover, as shown in FIG. 1 with the first stage deflection means 315, or after the final lens of the respective projector, as is the case with the second stage deflection means 325 in FIG. 1. In this apparatus, a multipole electrode is used as deflection means both for shifting the image in relation to the stage motion and for correction of the imaging system in conjunction with the alignment system. These deflection means 315, 325 are not to be confused with any additional deflection array means that may be present within the PD device which are primarily intended for correction of individual beamlets (Austrian patent application A 1711/2003 of the applicants).

FIG. 2 shows a plan view of the arrangement of apertures in the PD device 20. A plurality of square-shaped apertures 21 is provided which are arranged within a PD field pf in a regular array in which the apertures 21 are aligned along adjacent lines p1, wherein in each of the lines p1 the same number of apertures is present. Seen along the direction perpendicular to the lines p1, the apertures form a sequence of rows r1, r2, r3; in the embodiment shown, the rows r1-r3 are not adjacent but spaced apart. The apertures are arranged in the PD field pf according to a skewed regular arrangement such that the apertures of every third row align (n=3) as the pitch pn between neighboring rows is three times the width w of an aperture (i.e., pn=n×w). In the arrangement of FIG. 2 the offset pm between neighboring rows is 4 times the width of an aperture (i.e., pm=m×w with m=4), and within a line p1, the offset of apertures is n·pm=12. Thus, the apertures cover only 1/(n×m)=1/12 of the area of the field pf and, at a time, only one out of n×m=12 image elements can be exposed as shown in FIG. 3; the other elements are exposed in subsequent steps by means of moving the substrate along the "scanning direction" sd relative to the image of the apertures. For details about spatial arrangement and circuitry to control the apertures, the reader is referred to the US-2003-0155534-A1.

FIG. 3 illustrates the image field mf produced on the substrate; for the sake of clarity it is assumed that all apertures are switched on in this figure. The width fw of the image field is the width L of the PD field pf reduced by the demagnification factor of the projection system. The image field is composed of a plurality of image elements mx (also referred to as pixels). For a given position of the image field on the substrate, each of the apertures 21 of the aperture array corresponds to an image element mx, but as the apertures only cover a fraction of the PD field area, only a corresponding fraction of the number of image elements (shown hatched in FIG. 3) can be exposed at a time. In order to expose also the other image elements, the substrate is moved under the beam so as to shift the image field on the substrate. It will be clear that any alternative way may be used for effecting a relative motion of the image over the substrate; for instance, in one suitable way for nano-scale beam patterning with a stable substrate position, the beam is deflected over the substrate. FIG. 3a illustrates the exposure of pixels in subsequent positions of the motion of the substrate through the possible 12 (=n×m) positions; the pixels are accordingly referenced with letters a to l (the pixels shown hatched are position a). The whole image field mf is moved over the surface of the photoresist-covered wafer serving as substrate 41 so as to cover the total area of the substrate surface. The scanning direction sd may also reversed when one sequence of die fields is finished and imaging of the next sequence begins (boustrophedonal motion as in FIG. 4 of US-2003-0155534-A1).

Figure 4:
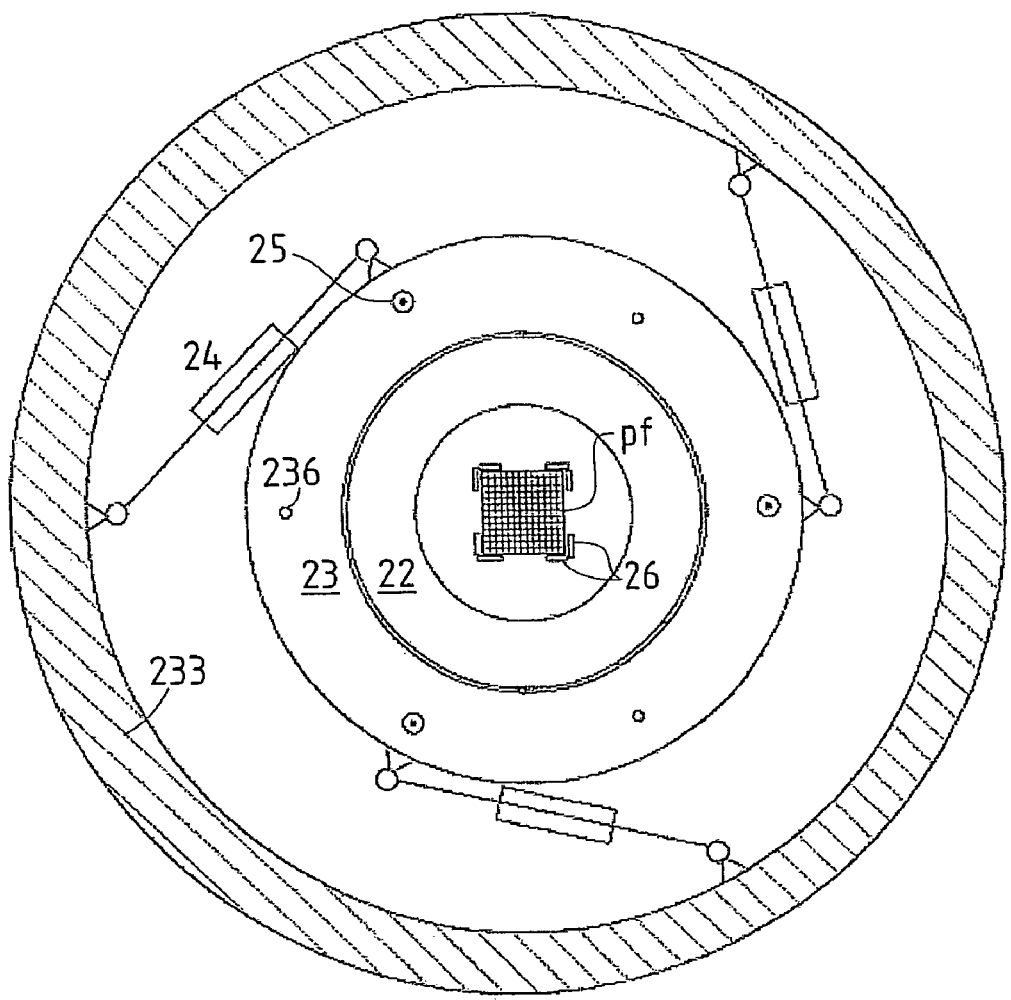
FIGS. 4 and 5 the PD device of the lithography apparatus of FIG. 1 in a top view (FIG. 4) and a longitudinal section (FIG. 5)
Figure 5:
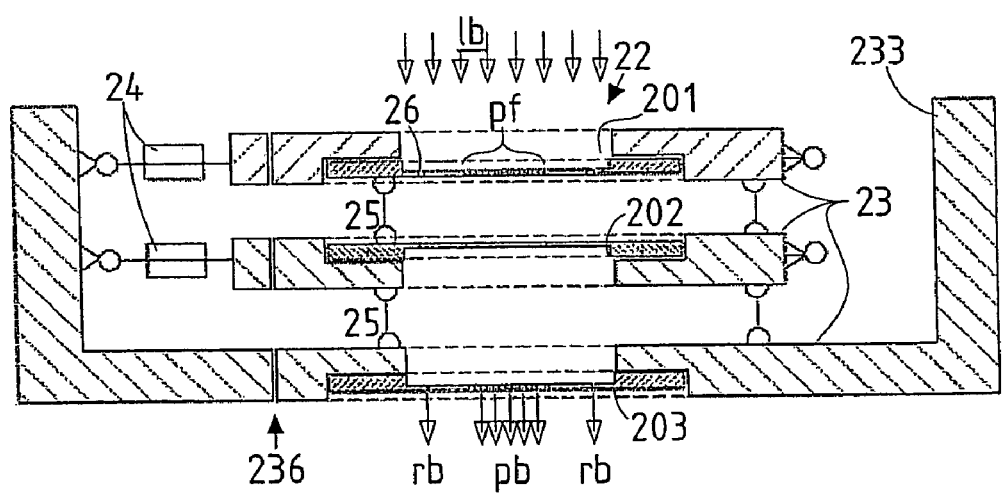
Figure 6:
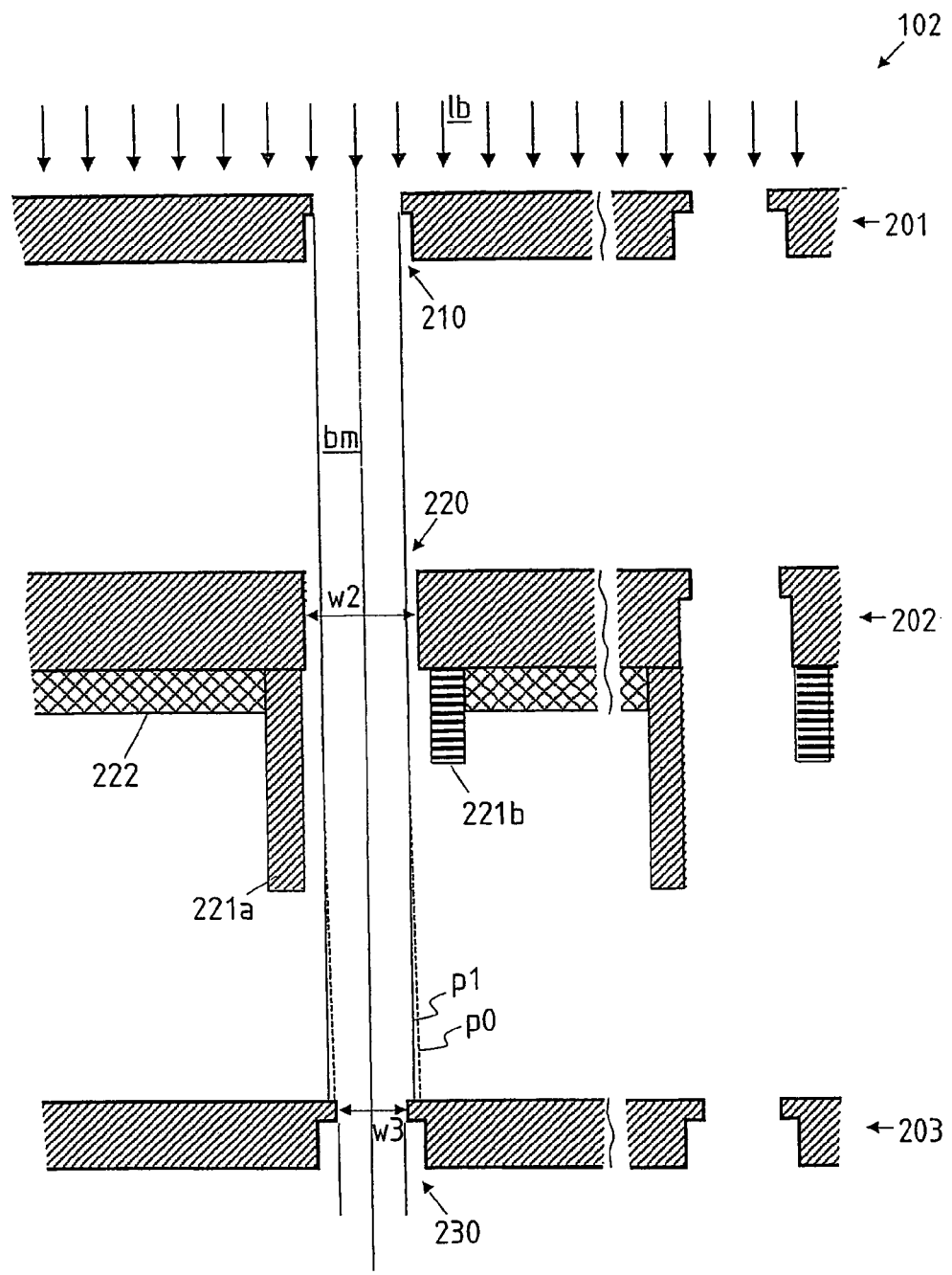
FIG. 6 a detail of FIG. 5 along two apertures.

FIGS. 4 and 5 show the architecture of the PD system 102, namely, in FIG. 4 a top view and in FIG. 5 a longitudinal-sectional view. FIG. 6 shows a detail of FIG. 5, illustrating the configuration of the set of plates constituting the PD system 102 of the present embodiment along two apertures. The PD system 102 comprises a number of plates 22 mounted in a stacked configuration, realizing a composite device whose components serve respective functions. Each of the plates 22 is realized as a semiconductor (in particular silicon) wafer in which the structures were formed by micro-structuring techniques known in the art. The lithography beam traverses the plates through an array of apertures in the PD field pf (FIG. 5). Each aperture corresponds to a set of openings 210, 220, 230 which are defined in the plates 22 (FIG. 6).

The thickness of each of the plates 22 is about 500 µm to 50 µm in the area of the apertures; their mutual distance is in the order of 10 µm to 1 mm. It should be noted that in FIGS. 5 and 6, the dimensions in the longitudinal axis (z-axis parallel to the optical axis of the apparatus) are enlarged and not to scale.

The blanking of the beamlets is controlled by means of a blanking means realized as a blanking plate 202 which comprises an array of openings 220 ("blanking openings"), each corresponding to an aperture. Each blanking opening 220 comprises a set of beam blanking electrodes 221 as well as the circuitry 222 for controlling the electrodes 221a,221b, which are accommodated, for instance, on the lower surface layer of the blanking plate 202. The blanking electrodes 221, serving as aperture deflection plates as described below, are formed around the blanking openings by perpendicular growth employing state-of-the-art techniques. In order to provide a better shielding of the blanking openings against cross-talking and other unwanted effects, one of the electrodes 221a may be formed so as to have a substantial height over the blanking plate 202. Preferably, this electrode 221a is connected with a uniform potential (e.g., ground potential) for all apertures, while to the other electrode 221b the controlling potential for switching between the 'on' and 'off' states is applied. Further details about the layout of the blanking plate 202 and its circuitry 222 can be found in the US-2003-0155534-A1.

The PD system 102 further comprises an aperture array means which serves to define the shape of the beamlets laterally and which is here realized as an aperture array plate 203 (in the following in short 'aperture plate') with an array of openings having a width w3, positioned after the cover and blanking plates 201, 202. More details about the layout of the aperture plate 203 can be found in the US-2003-0155534-A1.

Figure 22:
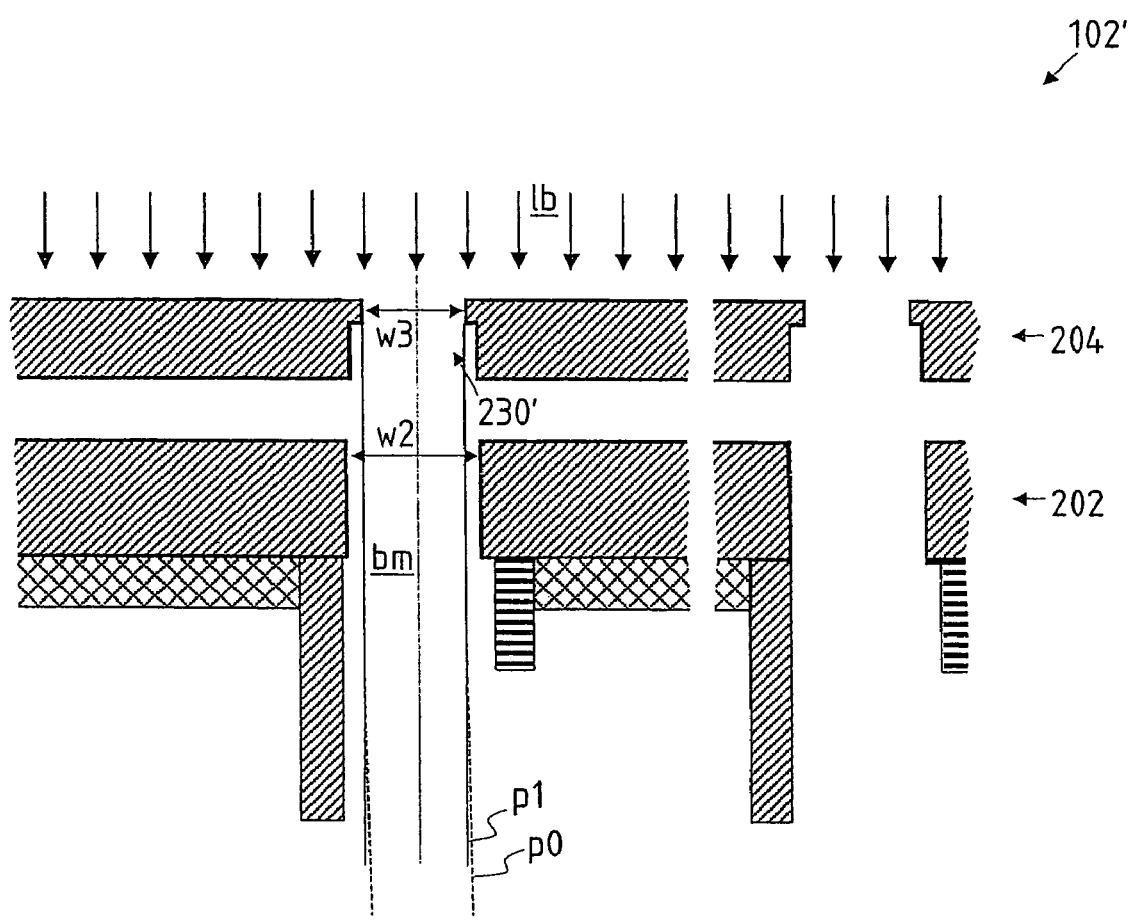
FIG. 22 a variant PD device in a detail like FIG. 6.

Preferably, the sequence of the functional plates, the cover plate, the blanking plate and the aperture plate, is chosen in a way that plate-to-plate alignment, heating and charging effects inside and between the plates of the PD system can be controlled easily. The arrangement shown in FIG. 6, in which the cover plate is positioned on top, the blanking plate in the middle and the aperture plate at the bottom as seen from the direction of the incoming beam, is just one possible arrangement. Other possibilities might be an arrangement of a PD device 102' shown in FIG. 22 where the aperture plate is combined with the function of the cover plate to a "beam forming plate" 204 which is positioned above the blanking plate 203, or the beam forming plate is bonded directly on the blanking plate. In this case, the beamlet bm is defined upon passing the aperture 230' with the appropriate width w3.

In front of the aperture and blanking plates 202,203, as seen in the direction of the lithography beam, a cover means realized as a cover plate 201 is provided in order to protect the other plates from irradiation damage. The cover plate 201 takes up the majority of the impingent lithography beam lb; the particles can only pass through the openings 210, formed in an array corresponding to that of the blanking plate, which openings make up only a small fraction of the total area of the blanking field bf. More details about the layout of the cover plate 201 can be found in the US-2003-0155534-A1.

It is the aperture 230 of width w3 (rather than the initial opening in the cover plate 201) which defines the lateral shape of the beamlet emerging from the system 102 (corresponding to the width w of an aperture in FIG. 2). Therefore, strictly speaking the term 'apertures' should be reserved to the openings of defined shape and width w (FIG. 2) as defined by the beamlet-defining apertures 230, in contrast to 'opening' which is used as generic term; however, the term 'aperture' is also used to denote the set of corresponding openings 210, 230, 220 through which one beamlet bm propagates, as in FIG. 6.

The width w2 of the blanking opening 220 is greater than the width w1 of the opening 210 in the cover plate 201, so the beamlet bm defined by the latter opening will pass through the former opening without affecting the controlling circuitry 222 on the blanking plate 202. For instance, the width w2 can be 7 μm (as compared to the defining width of the aperture of w=5 μm).

The beamlet bm transgresses the subsequent openings of the plates 22 along the path p1 and is then imaged in the imaging system (FIG. 1), provided the blanking electrodes 221a,221b are not energized; this corresponds to the "switched-on" state of the aperture (with respect to the switching state, no distinction is made between the blanking opening, the respectively associated aperture or beamlet defined by that aperture). A "switched-off" aperture is realized by energizing the electrodes 221a,221b applying a transverse voltage. In this state, the blanking electrodes 221a,221b deflect the beamlet bm off the path p1 to a deviating path p0 so the beamlet will be absorbed, for instance at the stop plate 204 (FIG. 1) positioned at some place after the PD device.

It should be appreciated that the beamlet bm will be deflected in the switched-off state by an angle which will be rather small, and the beamlet may still pass through the aperture 230 as shown in FIG. 6; however, the deflection caused by this angle is sufficient to bring about a lateral deviation of the angel at a later position that it is easy to block off the ("switched-off") beamlet.

Referring again to FIGS. 4 and 5, the plates 22 are held by chucks 23 which are positioned with respect to each other by means of actuators 24,25 realized as piezoactuators or nanopositioning elements of known type. The vertical actuators 25 may also be left off in order to save space; then the positioning between the plates is defined by the height of the chucks 23 themselves which then are simply stacked on each other. One of the chucks, in FIG. 5 for instance the chuck of the last plate, may be formed as a cup 233 so as to facilitate lateral positioning of the other chucks. Preferably, the plates 22 and chucks 23 are produced from the same material, e.g. silicon, or materials having the same thermal expansion behavior in the operating temperature range. The chucks also provide for the electric supply of the blanking plate 202; for the sake of clarity, the electric lines are not shown in the figures.

In the plates 22 openings 26 are provided for the definition of reference beams rb. The shape of the reference beams rb is defined, for instance, in the opening formed in the aperture plate 203, whereas the corresponding openings in the other plates are wide enough so as to let pass the radiation for the reference beams rb. The reference beams rb and the patterned beam pb are then imaged towards the substrate plane; in contrast to the patterned beam pb, however, the reference beams rb do not reach the substrate 41 but are measured in the alignment system 60 as already mentioned above. The chucks 23 further have alignment openings 236 which serve as alignment markers for relative positioning of the chucks 23 and the plates 22 they hold.

Gray Scales

According to the PML2 concept explained above the substrate is moved continuously, and the same pixel on the target is covered many times by the sequence of apertures during the scanning movement. Thus, considering one pixel at some location on the target, if all apertures are switched on when they cover that pixel, this will result in the maximum exposure of the pixel, a "white" shade corresponding to 100%. A gray shade (e.g. 20%) is realized by switching on a corresponding number of apertures in the line (e.g., 20% of 90=18 apertures when there are 90 apertures in a line). Thus, the signal controlling the value of a pixel is represented by a gray scale code, for example an integer number coded as a binary number of n bits.

To realize gray levels, the US-2003-0155534-A1 proposes to subdivide the total amount of apertures in a line into columns, the number of columns corresponding to the number of desired gray levels (e.g. 30 columns to realize 30 gray levels). Severe difficulties arise with placing a shift register in between a dense array of apertures because of the large space requirement for the electronics. As a solution to this problem it was proposed to feed in the n bit data serially at a speed multiplied by a factor n over the scanning speed, and apply gray comparators to flatten the data down to one bit within each of the 30 gray level columns. While 1-bit shift registers toggle the "black and white" data stream from one aperture site to the next within each column, to keep the n-bit data available for the next gray column, interconnections between the columns transfer the data stream to memory buffers located in the beginning of the gray columns (i.e., at the space offered by aperture row offsets), where the data is buffered until the time delay (i.e., the total toggling time of the data stream through the previous gray column) is balanced.

The present invention aims to improve the PML2 concept with a more efficient way to encode and transfer an image using a PD device on a scanning substrate. According to the invention, the control of the blanking openings in the blanking plate and of the deflecting means controlling the switching state of the blanking openings (and corresponding apertures) are organized in a way which allows to directly feed 1-bit signals into the blanking plate which, leaving aside the processing of time delays between the individual blanking openings, do not require any further processing with regard to a gray scale signal; in particular, no decrementing or incrementing devices are needed to that end.

Blanking Plate and Gray Groups

In the following, the invention is described in the context of an arrangement of apertures with n=6 and m=6 (n×m=36). The minimum feature size to be illuminated on the wafer is 45 nm (referred as 45 nm node with 45 nm resolved lines and spaces), and the smallest spot is 25 nm (pixel width x in FIG. 3, equaling geometric image size of one aperture). The image field width fw is 81 μm; in order to produce this image field in connection with a 200× demagnification projection system (see above), the square-shaped PD field has a width L=16.2 mm, corresponding to a number of lines p1=L/w=3240, and 3240 bit streams are to be addressed by the incoming data stream. In the direction across, there are fw/(n·x)=L/(n·w)=90 apertures in each of the rows r1-r3.

The invention bases on the following consideration: A gray value is represented by a number, for instance a value out of the range from 0 to 31. For the range given, a set of numbers is chosen such that every value of the range (or at least every relevant value, if the range need not be represented entirely) can be expressed as a sum of numbers chosen from the set. For instance, a set (1, 2, 4, 8, 16) could be chosen to represent all values from 0 to 31; this is the binary-power decomposition where the choice of numbers from the set is always unique. It should be noted that other sets may be suitable as well, even sets where some numbers appear more than once. For instance, a set (2, 2, 3, 6, 14) may be used to express the range from 0 up to 27 except the values 1, 12, 14, 26; with this set, the value 18 would be represented as 2+2+14=1·2+1·2+0·3+0·6+1·14, or in a shorthand (11001). This shorthand is a sequence of bits which each represent one number of the set and take the value 1 if the associated number is used in the sum and 0 otherwise.

To generate a distinct number of exposures, which in total add up to a given intensity, one can use such a decomposition of the number representing the gray value (instead of using a linear increment or decrement) in to a set of bits to determine which apertures are switched on or off. This set of bits is used as gray signal, and each bit is associated with one group of blanking openings ('gray group'); the number of openings in each gray group is specified by the number which the gray bit represents.

As an example with a line consisting of $N \cdot 2^M$ blanking openings, a binary-power decomposition may be used for the gray level, corresponding to an implementation using M groups each comprising $N \cdot 2^n$ apertures, with n=0 to M−1 corresponding to the index of the gray bit, and N being the number of the apertures of the lowest (non-zero) gray level. Then, any gray level spanned by the M-bit range from 0 to $2^M - 1$ can be expressed by a simple binary number, each gray level x corresponding to a number of x·N blanking openings. (Equivalently, one could also say, the partition of the openings is (N, 2N, . . . , $2^{M-1}$N).) For example, to create values between "0" and "31" a linear independent basis corresponding to a 5-bit is used. In this example, since the (decimal) number 13 is represented as binary (01101), a gray level 13 may be generated according to a partition of the number 13=1+4+8 in such a way that the groups with index 0, 2 and 3 are active and contribute N, $2^2 \cdot N = 4 \cdot N$ and $2^3 \cdot N = 8 \cdot N$ blanking openings to the cumulated exposure dose, respectively, whereas the remaining groups are not active and do not contribute at all. The particular advantage of this approach, by partitioning the many levels (in the example, the $2^M$ gray levels) into a (smaller) number of constituting numbers (in the example, the M binary powers from 1 to $2^{M-1}$), is that the data transfer issues become much simpler. It should be appreciated that the same considerations apply if a non-binary-power decomposition is used.

For each gray group of blanking openings, only the first elements of the shift registers, namely, one per group, are to be refreshed by the incoming data stream (or the last for scanning in opposite direction, details of the electronics needed for reverse scanning direction are described in the US-2003-0155534-A1). The signal which is fed to a gray group, and which is directly used as control signal for the first blanking opening of it, is called group control signal in the following. The group control signal is handed from one blanking opening to the next through delay means which provide the delay as needed in correspondence with the scanning motion of the pattern image over the target. A single bit gray control signal (one bit per clock cycle per line) suffices to generate all respective exposures for a gray group. As a consequence of this concept, the number of feeding lines to be supplied to the blanking field bf is greatly reduced as compared to some prior art, in particular Yasuda et al., where all apertures were addressed individually from the outside, and there will be sufficient space to feed in the data streams from the upper or lower side of the aperture plate.

Figure 7:
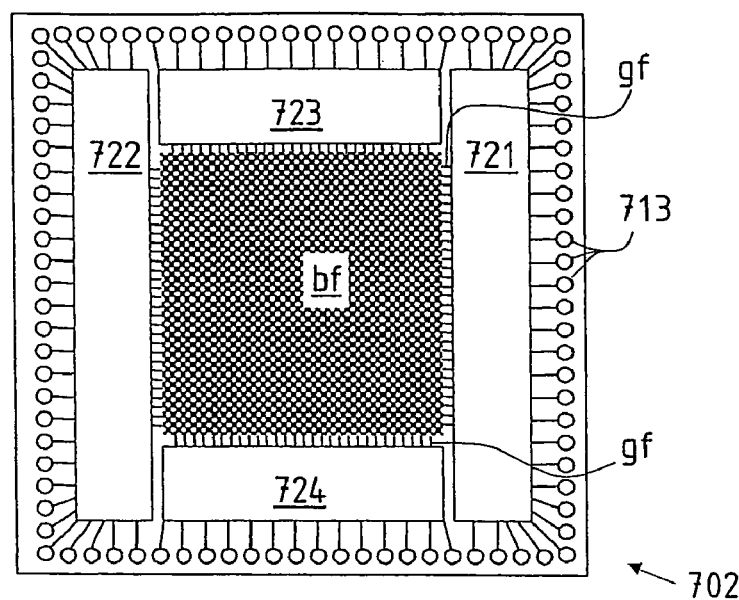
FIG. 7 a plan view of the blanking plate according to a first embodiment of the invention.

One suitable embodiment of a blanking plate 702 according to the invention is shown in the plan view of FIG. 7 (the other plates of a PD device, such as the cover and aperture plates, would have to be dismounted to reveal this view). In the center of the blanking plate 702, the blanking openings are arranged in a regular array of staggered lines forming a PD field as explained above with FIG. 2. Consequently, there are 3240 lines of blanking openings with 90 blanking openings each in the blanking field bf. Since this arrangement of openings cannot be represented to scale, the field bf is represented with a cross-hatching only in FIG. 7. At the periphery of the blanking plate 702, the data stream of the pattern to be produced is fed in via a number of pad connections 713. Since due to necessary size of the pad connections their number is limited, the pattern signal is multiplexed to a smaller data width at a higher data rate, with the data width corresponding to the number of pad connections. Converter means 721, 722, 723, 724, which are preferable positioned surrounding the field bf, decode the data to the control signals which are applied to the blanking openings in the field bf. These signals are applied using a number of feeding lines 711 (only a part of the feeding lines are shown in the figure for sake of clarity; actually, the number of feeding lines 711 is several thousands, as explained below).

Figure 8:
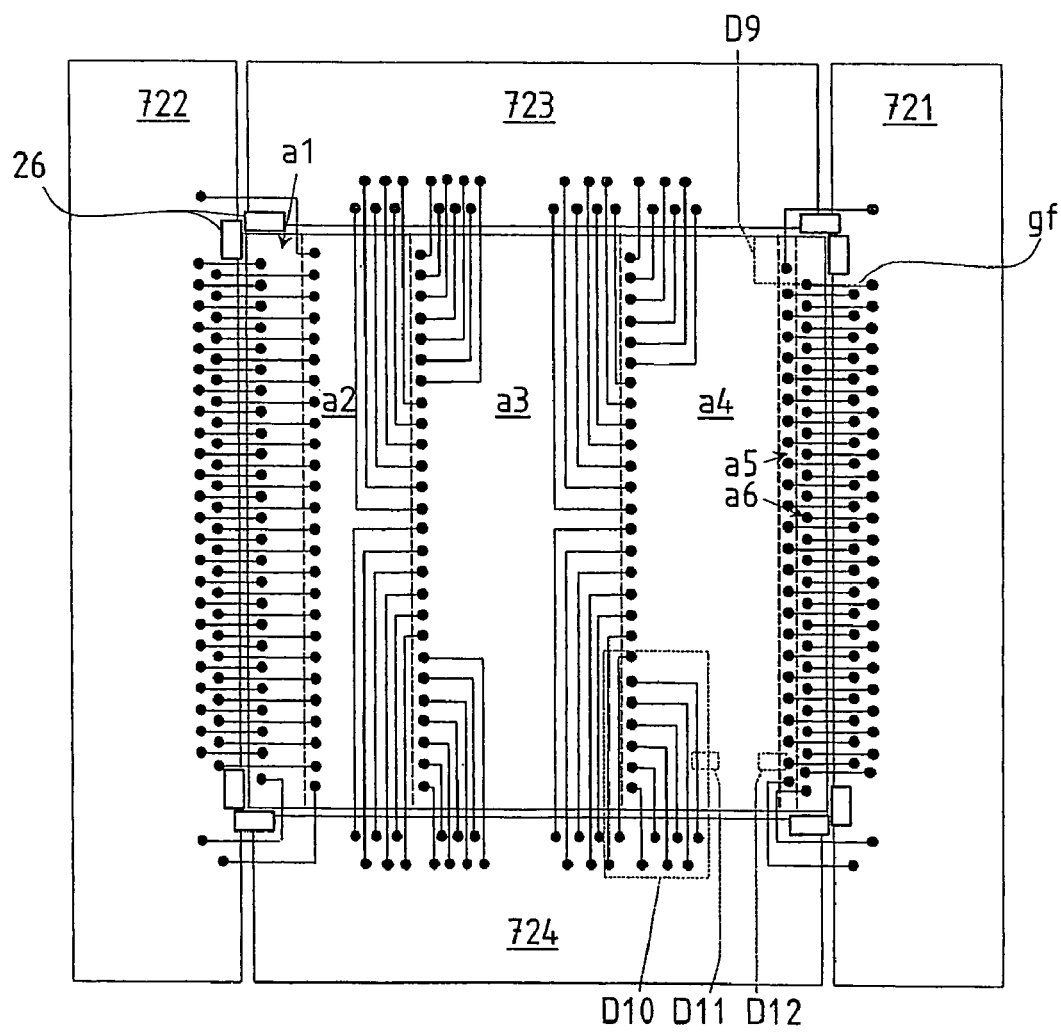
FIG. 8 the layout of the 'gray groups' of blanking openings and their feeding in the blanking plate of FIG. 7.

Referring to FIG. 8, the blanking openings of each line are organized into gray groups as explained above. The openings of each group are positioned consecutive (also see FIG. 9a), and furthermore, the grouping is the same for every line of the blanking plate 702. Consequently, the corresponding groups of the lines form stripes running perpendicular to the lines (or, equivalently, perpendicular to the scanning direction). The areas covered by these stripes are delineated by dashed lines in FIG. 8 for reference and denoted by reference symbols a1 through a6. In this embodiment, the groups have the following numbers of blanking openings: 8, 16, 32, 28, 2, 4, going from left to right in FIG. 8. Such a distribution of apertures allows to generate levels from 0 to 45 (2 aperture for a level), i.e. 46 gray levels. It should be noted that the same arrangement works with any order, for example a cyclic permutation of the groups, as the same gray scale values can be realized by only reordering the group signals accordingly and applying adequate phase shifts for the group control signals.

FIG. 9 shows details of the arrangement of groups. For better clarity (and compactness of the drawings), the arrangement of blanking openings is depicted as for n×m=4×3=12 in FIGS. 9 to 13, 15 to 17 as well as 21; it should be kept in mind that the underlying embodiment in fact uses n×m=36, but the following considerations can easily be taken over and adapted between these cases.

Figure 9A:
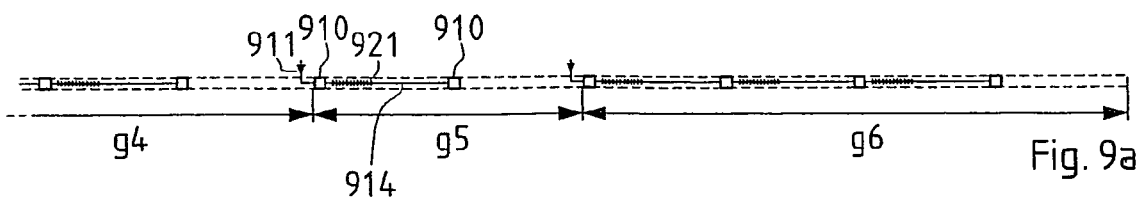

FIG. 9a shows the end (rightmost apertures of FIG. 8) of the first line of the blanking field. The last four blanking openings 910 form the last group g6, the two blanking openings 910 before them the second last group g5. For each group, the first blanking opening is fed the respective group blanking signal through a feeding line 911 (corresponding to one of the lines gf of FIG. 8). The feeding line usually consists of screened conductive lines fabricated on a metallic layers of the wafer and/or electronics to synchronize the signal. If preferred, also toggling via shift registers could be used to feed the signals to the gray groups.

Figure 9B:
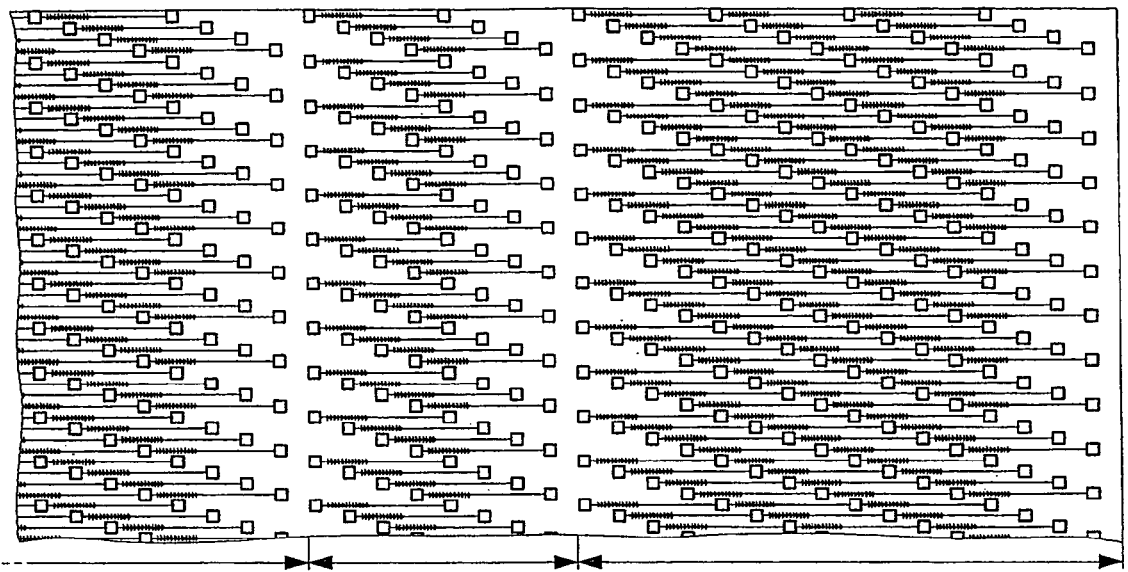

FIG. 9b gives an overview of how the groups g4, g5, g6 of neighboring lines from the stripes a4, a5, a6 when the sequence of groups is the same for the lines. (FIG. 9b is a detail of FIG. 8 as denoted by the dashed box D9.) Within each group, the signal is propagated from one opening to the next by means of interconnections which comprise delay means 921 and interconnecting lines 914. The delay means 921 serve to provide the appropriate time delay between consecutive apertures in a line as the pattern propagates through the PD field (compare the discussion in the US-2003-0155534-A1, FIGS. 17 and 18). In the special case of FIG. 9, the delay means 921 are realized as a sequence of shift registers, and each delay means uses an oblique area between the two openings which it connects.

If possible delays due to the travel times of the group control signals from the multiplexers to the first apertures of each group are compensated, for example during preprocessing by setting appropriate signal phases, no additional memory buffers are needed besides the already mentioned delay means in order to achieve the required signal synchronization. The circumvention of additional high frequency electronics offers a significant simplification compared to prior BAA layouts. In the layout of FIG. 7 the group blanking signals are fed in from all sides, as illustrated in FIG. 8. In the logic of the blanking plate 702, and in particular in the blanking opening field bf, neither gray comparators nor DRAM buffers are required, which were mandatory in US-2003-0155534-A1. The high frequency logic electronics which still are necessary, such as the converters 721-724, can be fabricated in the thick wafer area, outside the field bf. The described chip layout alleviates the thermal and timing issues connected with the large number of feeding lines gf.

One of the main differences of the present invention over prior art is that the group blanking signals are delivered directly to the first blanking opening of the corresponding group of blanking openings (more exactly, to the respective control circuitry of that opening). This is shown in FIG. 8 for a representative number of feeding lines gf, each starting from one of the converters 721-724 and ending at the site of a first blanking opening of one of the groups in the stripes a1-a6. Not all of these lines gf are shown in FIG. 8 due to the very large number of feeding lines that are actually present (namely, 3240×6=19,440 lines); rather, the lines gf shown in FIG. 8 shall give the overall idea of the paths of the lines. It is important to recognize that the feeding lines gf do not intersect; favorable to this condition, the path of the lines are chosen to run directly to the nearest side of the field bf. The position of reference marks 26, around which the converters 721-724 are positioned, is also depicted in FIG. 8.

As a consequence of this feature, neither memory blocks nor gray comparators, which would necessitate additional spaces between the apertures (such as the 'row offsets' of the US-2003-0155534-A1), are needed.

Figure 10:
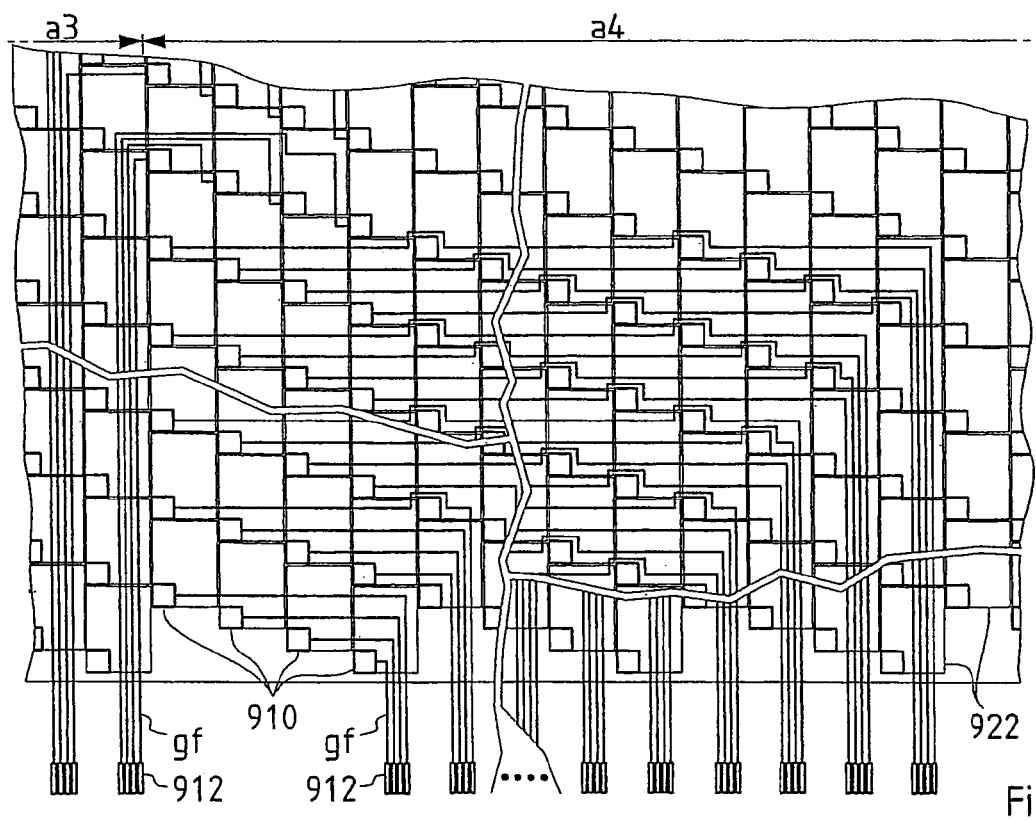
FIG. 10 another detail of FIG. 8 with the feeding lines of the gray groups.
Figure 11:
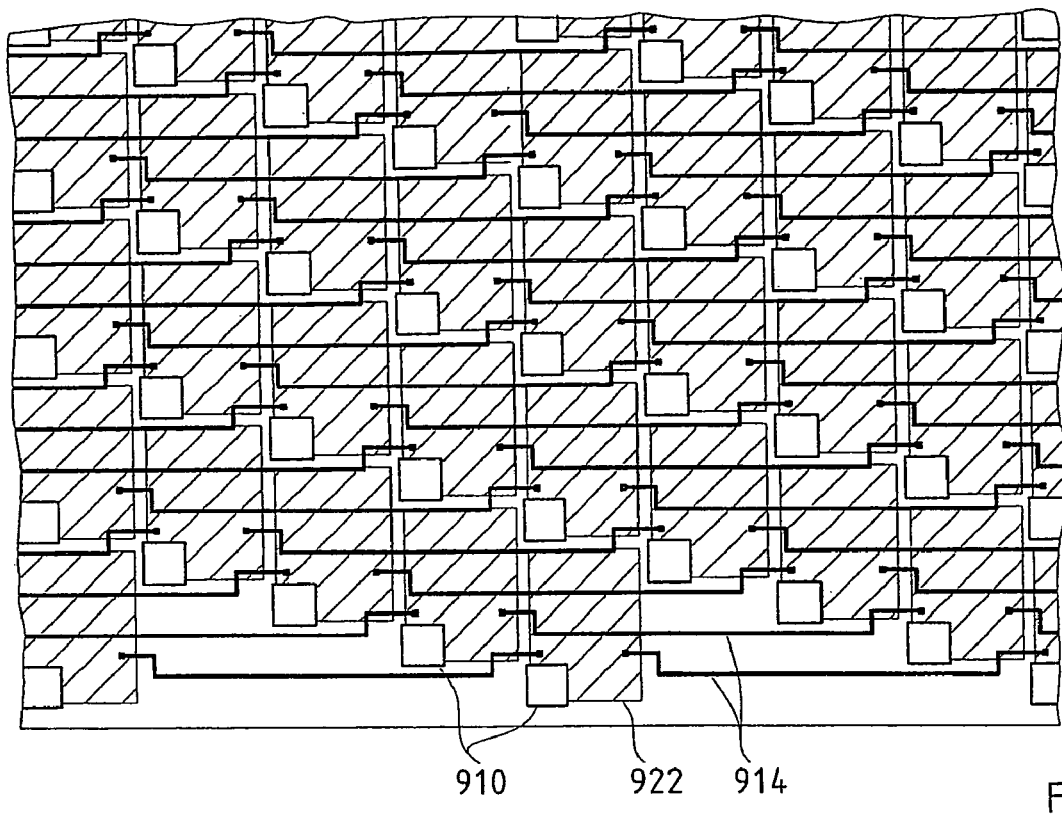
FIGS. 11 and 12 two further details of FIG. 8 showing the interconnection of the group signals within the gray groups.
Figure 12:
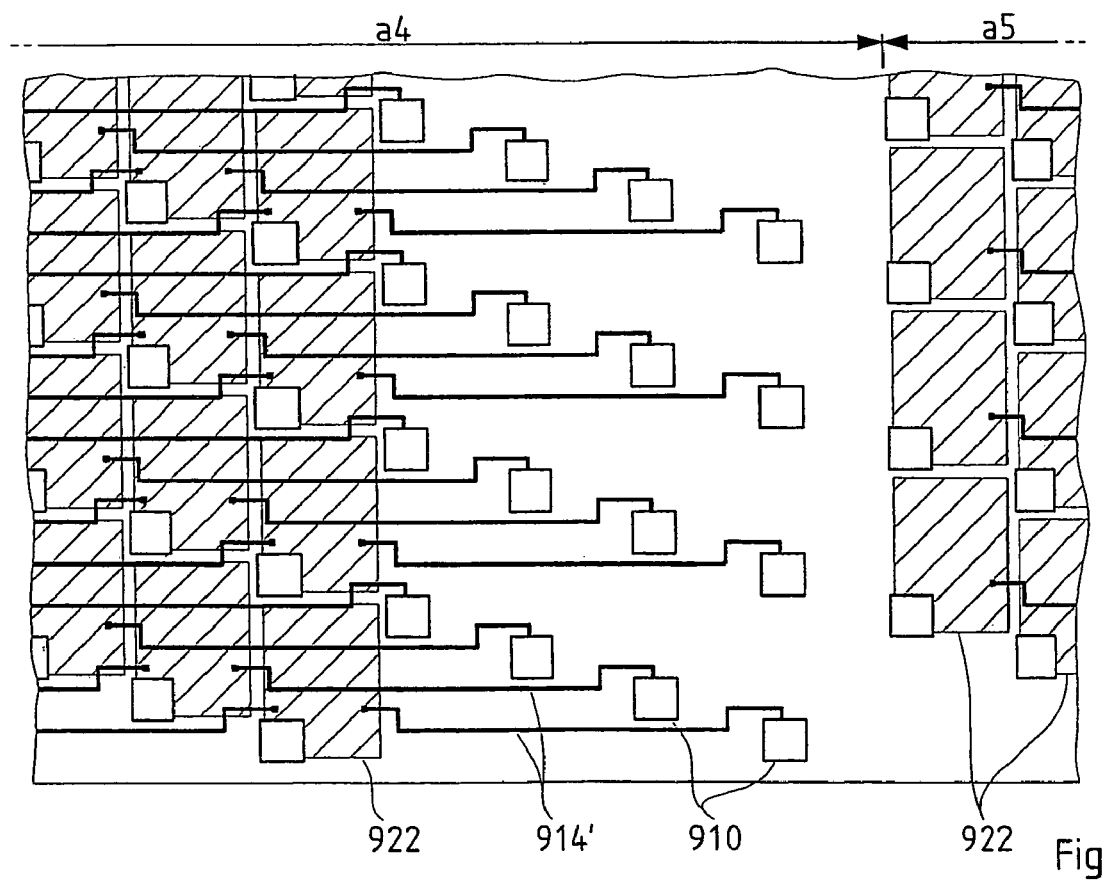

FIGS. 10 to 12 illustrate the pathway of the group control signal in the blanking plate. FIG. 10 gives a detail of FIG. 8 (marked there by the dashed box D10) showing the feeding lines gf that are fed to the blanking openings 910 of the outer region of the stripe a4; these group control signals are fed from the bottom side of the field bf (bottom side with respect to the FIGS. 8 and 10; a lateral side with respect to the scanning direction) at connection fields 912. For each blanking opening an area is reserved, in FIGS. 10 to 12 marked as boxes 922 (which are hatched in FIGS. 11 and 12), in which the circuitry of the delay means of the respective blanking opening 910 is provided, beside the associated electric control elements (capacitors) of the deflector elements. Thus, the boxes 922 correspond to the items 921 of FIG. 9b, but with a different allotting of space to the array of blanking openings. Due to the repeat count n=4, the feeding lines gf are likewise grouped in groups of 4 lines.

FIG. 11 shows the interconnection between successive blanking openings, which provide the propagation of the group control signals within the respective groups. Each interconnection line 914 begins at the output of the delay means of one box 922 belonging to a blanking opening and runs to the input of the next blanking opening, where it will both feed the input of the associated delay means and the control of the deflection electrodes. The interconnection lines 914 are formed in a different electric layer as the feeding lines gf shown in FIG. 10.

FIG. 12 shows the interconnection lines at the end of groups. The interconnection line 914' which supplies the signal to the last blanking aperture of a group is directly fed to the deflecting electrode control since no delay means is needed for this blanking opening. The last blanking opening of a gray group represents a dead end for the data propagating through the group; the data line should be terminated by appropriate electric means such as a terminating resistance (not shown) in order to ensure that reflection of the signals at the end of a line are avoided. The termination of data lines can be done outside the PD field to allow a reduction of heating produced in the blanking field bf. Other possibilities for a closure of the line would be a second line (return line) for each signal, or high frequency technologies such as "twisted pairs". Apart from these aspects, FIG. 12 corresponds to FIG. 11.

In the above embodiment, the groups of blanking openings followed the same order in each line. The sequence can, however, vary between the lines. Such a variant is illustrated in FIG. 13.

Figure 13:
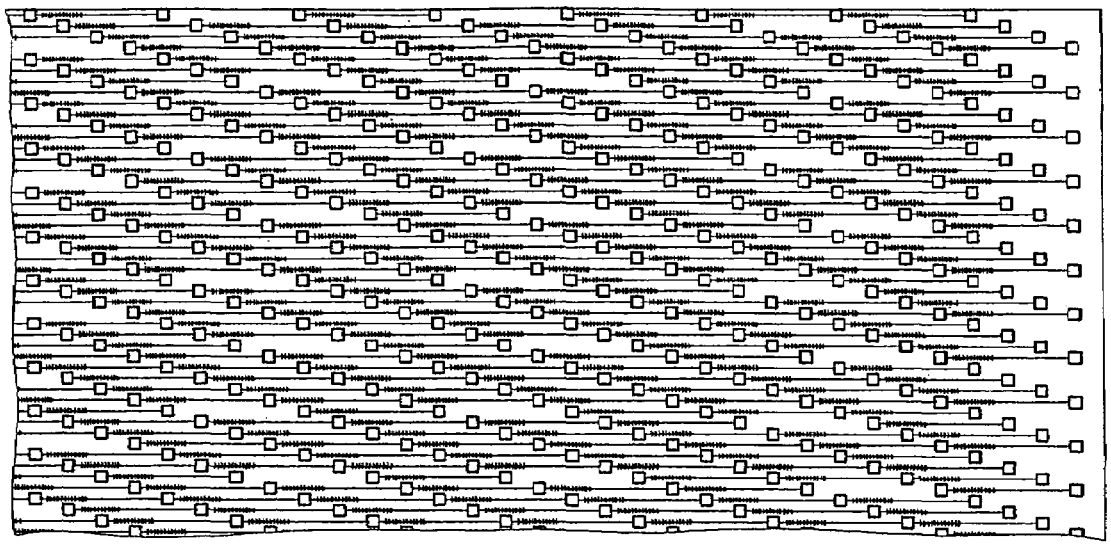
FIG. 13 another arrangement of gray groups.

FIG. 13 shows the edge of the field bf, analogous to FIG. 9. In this variant, however, the sequence of groups are different for each line. While in each line the number of openings still obey the partitioning (2, 4, 8, 16, 28, 32), the actual order represents various permutations of these numbers. More specifically, one possible pattern, of which FIG. 13 gives a detail, would be the following sequence of gray group ordering starting from the uppermost line as shown in FIG. 13: (16, 28, 8, 32, 2, 4), (4, 16, 28, 8, 32, 2), (2, 4, 16, 28, 8, 32), (32, 2, 4, 16, 28, 8), (8, 32, 2, 4, 16, 28), (28, 8, 32, 2, 4, 16) and then repeating from the beginning. This sequence realizes a cyclic exchange of the groups; in other embodiments, mirroring or free permutation of the sequence may be used.

The main advantage of using permuted sequences of gray groups in the PD device is that it allows to effectively smooth the current density distribution of the dynamically structured beam over the cross section of the beam diameter. Therefore, the current density distribution becomes largely independent of the particular layout, avoiding pattern related image distortions due to Coulomb interaction. Pattern related image distortion is one of the main limiting factors of the usable current in PML2, lowering productivity and overlay capability.

Data Pre-Processing

Figure 14:
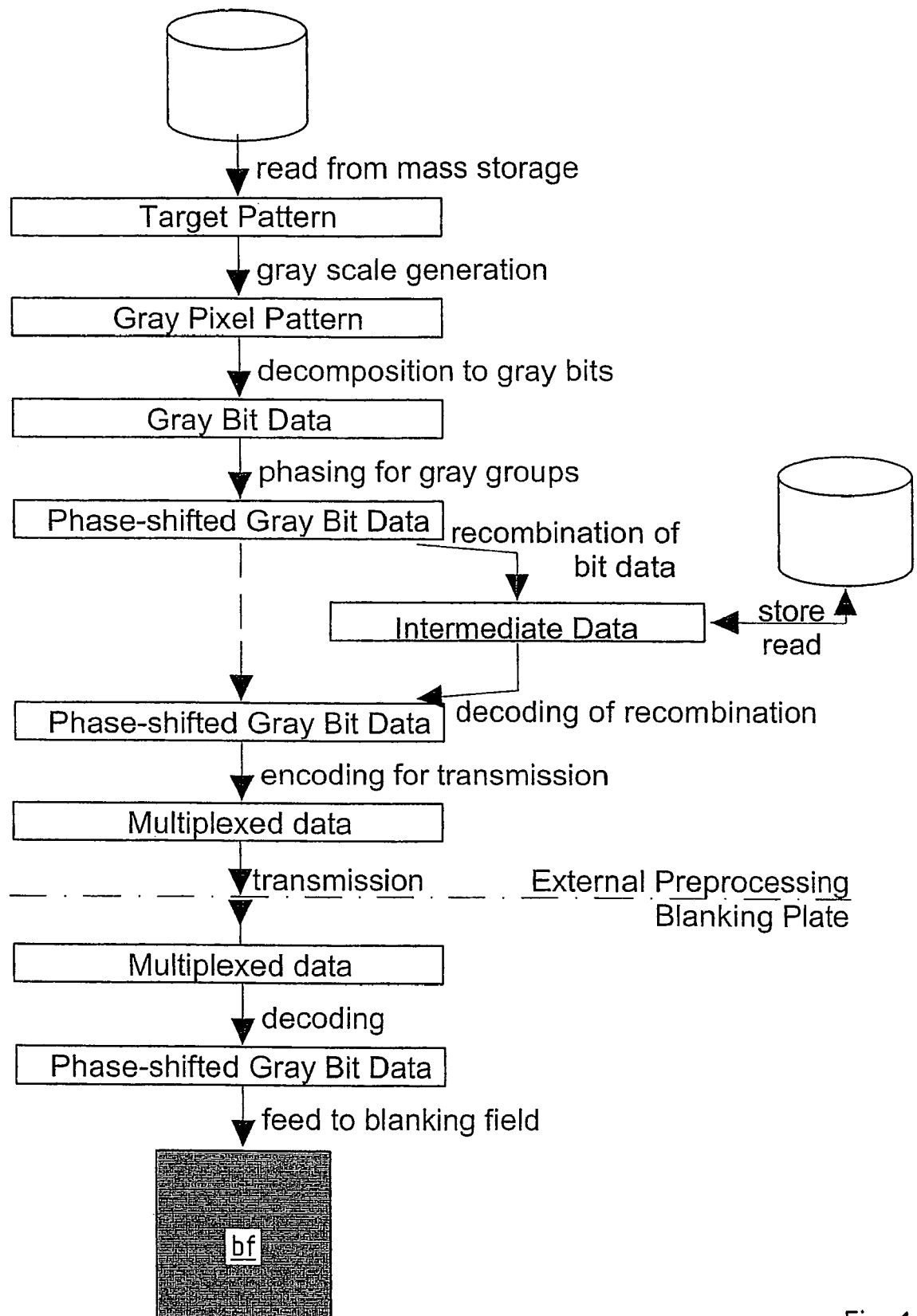
FIG. 14 a flowchart of the data pre-processing for the blanking plate.

FIG. 14 illustrates the data pre-processing and data loading for the blanking plate. As already mentioned, there is a steady stream of parallel data (3240 lines times 6 gray groups) fed to the blanking plate. Due to the fact, that there is only a limited number of lines (e.g., assuming less than 200 pad connections 713) available to the blanking plate, multiplexing will be used to work around this bottleneck. In other words, the high number of parallel data (6×3240 bits) at a given rate (for instance, 8 MHz) is converted to a low number of data (e.g. 135 bits) at a high data rate (144× 8=1152 MHz). On the blanking plate, that data are then converted back in the converters 721-724 to the parallel data which can applied to the gray groups through the supply lines gf. To reduce the data rate at the blanking plate the supply lines may be arranged around the whole circumference of the PD field; for example with the square-shaped PD field of 16.2 mm width fabricated on a 25 mm chip as discussed above, up to at least 1250 bonding pads with 80 μm width could be put in line along the rectangular frame, allowing to reduce the data rate to 128 MHz by 16 bits multiplexing.

The data preparation process starts from a target pattern which is held on a mass storage and, according to state-of-the-art methods, converted in to a gray-scale pattern that takes into account all necessary corrections such as the proximity correction and space charge homogenization as required by the particle-optical projections system (FIG. 1). This gray-scale pattern already is laid down in pixelized form. The gray-scale data of this file are then converted into gray-bit data by decomposition of the gray values according to the gray groups present in the blanking field bf. The gray bit data thus obtained are then shifted to each other according to the individual phase shifts that the gray groups require due to the relative position of their respective first blanking opening on the blanking field bf. This data processing step yields a phase shifted gray-bit data stream which may be directly used to control a pattern write process; preferably, however, off-line data preparation is made, and the stream data are conveniently stored in an intermediate storage. For this intermediate storing it is advantageous to compress the bit data to an intermediate data form allowing compact storage in a data file. If the phase shifts to be set were not integer values of the clock cycle, the signal would have to be calculated by interpolation of the gray pixel data. In a preferred embodiment, the positions of the apertures on the blanking plate and the signal transfer times to the apertures are chosen in a way that the phase shifts are integers of the clock cycle; then the phase shifts are easily adjusted by forward or backward shifting of the gray data stream without additional data manipulation. At the time of actual exposure of the target, the intermediate data file is decoded to recover the phase-shifted gray-bit data stream. The stream is encoded to a data format of lower bandwidth and higher data rate (multiplexing as explained above), and in this form it is transmitted to the blanking plate. On the blanking plate, the data stream is decoded in the converter means 721-724 and fed to the blanking field bf.

Using this data preparation pathway, no buffering of data is needed on the blanking plate or PD device. Since the decomposition of the data stream into gray bits (group control signals) and their synchronization may require a large amount of CPU time, this process is preferably done off-line prior to exposure.

The present invention offers a wide scale of advantages over the prior art:

Largely reduced complexity of the blanking plate. Neither complex wiring nor extensive memory blocks or buffers are needed for processing of the gray scale data.

Relaxed risks. Due to the reduced circuitry on board of the blanking plate, the heating is largely reduced. For the same reason, manufacture risks are alleviated, and the resistance against X-ray irradiation is improved. Downscaling is encouraged with respect to both shift register electronics and the lithographic node. Additionally, the risk of defects is reduced by a defect correction concept.

Significant performance improvements. These are due to the possibility to use an increased number of gray levels, an increased density of apertures (increased void ratio), a non-unique coding which allows to better control space charge, and a reduction of pattern dependent distortion.

Advantageous data pre-processing. A simple "off-line" routine can create time-delayed signals which can be transmitted with an overall reduced transfer rate.

Extra Gray Groups; Defect Correction

In order to take into account for possible defects or other problems in the context of gray scaling, it is possible to include spare blanking openings which can be enabled or disabled depending on the number of defects per line. To provide this option, more apertures than necessary could be structured for some or all channels, or, what seems more useful, an additional "extra aperture" group could be added in each line, so a specific number of apertures per line can be "activated" when needed, for example physically by focused ion beam modification of the corresponding connection lines, or by software controlled switching using implemented logics.

A possible procedure for defect correction could be: 1) determination of the needed number of extra apertures per line by calibration, using test patterns and beam analysis instruments, and 2) software-controlled switching or modification of the blanking plate so as to activate the required number of extra apertures which can be addressed by an individual group control signal, and 3) data pre-processing of the best achievable correction of the last bit of each individual line.

Figure 15:
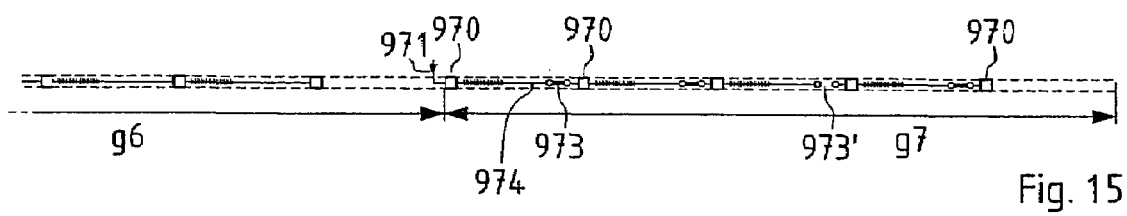
FIG. 15 an 'extra' gray group used in case of defect apertures.

For example in the embodiment of FIG. 8 with 46 gray levels, if in a line instead of the partitioning (8, 16, 32, 28, 2, 4) only (7, 16, 30, 28, 2, 4) were available due to one defect in the $1^{st}$ and two defects in the $3^{rd}$ gray group (as indicated by underlined numbers), an extra group with at least 3 blanking openings ('apertures') would suffice to approximate all values between 0 and 45 (2 apertures per level) with a maximum error dose of ½ of one level (corresponding to 1 aperture) occurring only for a few levels, provided that suitable corrections are pre-calculated for the gray levels of the five gray groups and the one extra group. FIG. 15 shows the end of a line with an extra group g7 having five blanking openings 970. The last two of these blanking openings were deactivated so as to leave three active blanking openings. The group g7 is controlled by means of a feeding line 971 like the other groups (compare FIG. 9a). In order to provide a way to easily deactivate blanking openings, a segment 973 of the connection 974 between successive apertures is realized on the surface; in a structural modification step, for instance by means of a laser or electron beam, this segment can be made non-conducting, effectively interrupting the connection as shown in FIG. 15 for the second last segment 973', thus deactivating all blanking openings behind that segment.

In one further example which relates to the configuration of FIG. 13, the lines are extended by 5 blanking openings in an extra group added at the some suitable position in each line (not shown), the gray groups would be (16, 28, 8, 32, 2, 4; 0), (3, 16, 26, 8, 32, 2; 3), (2, 4, 16, 28, 8, 32; 0), (32, 1, 3, 16, 27, 6; 5), (8, 32, 2, 4, 16, 28; 0), (28, 8, 32, 2, 4, 16; 0) if in the second and fourth line 3 and 5 apertures are defect, respectively (numbers representing groups with defect blanking openings are underlined; the extra group is always written at the end, regardless of its factual position within the respective line).

Figure 16:
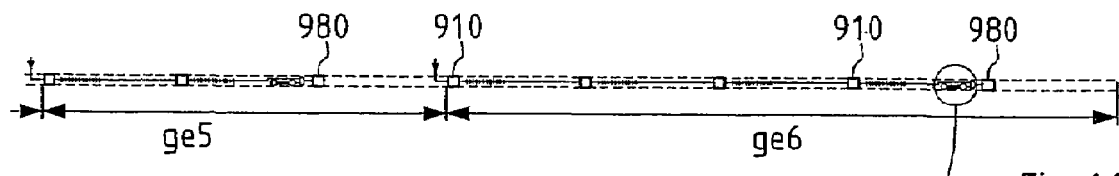
FIG. 16 gray groups with 'extra' apertures which are activated when needed.
Figure 16A:
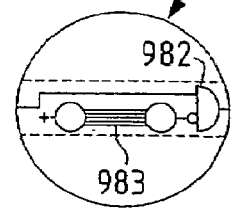

FIG. 16 illustrates another way to include extra blanking openings for defect correction. At the end of groups ge5, ge6 extra blanking openings 980 are provided. If needed these extra blanking openings are activated, for example by interrupting an associated line segment 983 shown in the detail of FIG. 16a. This line segment may, for instance, belong to a line which connects a logic 'high' potential to a negative input of an AND gate 982; interrupting that line will switch the gate 982 from an always-off state to a transmittal state for the group control signal (since the other input is floating), thus activating the blanking opening(s) 980 behind that gate. Alternatively, if a segment material is used which is primarily non-conducting, and can be activated to a conducting state by a structural modification, the segment 983 can be provided directly in the line as is the case shown in FIG. 15, without the need to provide a gate 982.

Gray Groups with Interlocking Grids

As a further development of the invention, arranging apertures of different groups according to "interlocking grids" may be realized which create additional exposure spots on the substrate. In the interlocking grids, the apertures of one or more groups are shifted with respect to the base array of the other groups in horizontal and vertical direction by a fraction of the aperture diameter, in particular one half diameter for square or rectangular grids.

Figure 17:
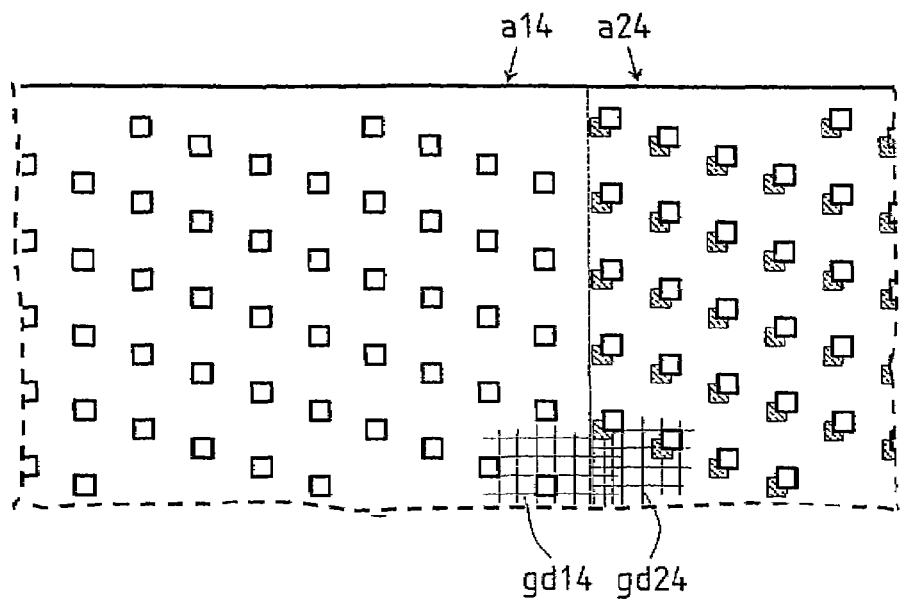
FIG. 17 an arrangement of apertures according to interlocking grids.

FIG. 17 illustrates concept of interlocking grids. This figure shows a detail of the boundary region between two gray group stripes b14, b24, where for the sake of simplicity a 4×3 array is depicted. An offset of the apertures is shown between the two stripes b14, b24. Either arrangement defines a grid gd14, gd24 of square pixels, which are shown in the lower inner edge of the stripes b14, b24. As becomes clear from this picture, the two grids are interlocking with respect to each other. The arrangement of apertures which would be present in the area of the stripe b24 if the arrangement of stripe b 14 were continued, is shown as hatched squares.

The aperture (i.e., blanking openings) in the area of stripe a24 are shifted by one half of the aperture width vertically and horizontally with respect to the positions of the apertures in the other stripe a14. As a consequence, an effective grid results from the superposition of both grids gd14, gd24, where the pitch of the effective grid is one half of the pitch of the base grids. The blanking openings belonging to different grids are addressed as separate gray groups.

Interlocking arrays allow spatial pixel interpolations, and hence an improved flexibility with respect to image placement and line edge roughness. By this procedure the required number of gray levels for a pre-defined address grid is significantly reduced. This is of particular importance if the dose variation due to statistical dose fluctuation (shot noise) is in the range of the dose precision needed for pattern placement and CD control. For a certain exposure dose and spot size only a limited number of levels are statistically distinguishable (e.g. only about 30 levels for 25 nm square-shaped spots and 1 electron/$nm^2$ exposure dose). Interlocking grids can be used to interpolate an existing pixel representation, for example, to reduce the required number of gray levels—which may be important when down-scaling of the PD field is desired—or to improve resolution by using a smaller address grid, for example, for the most critical lines such as transistor gates. The necessary data pre-calculation, such as for example the calculation of a linear interpolation interlocking grid for a given gray pixel data, can be done during operation or off-line.

It is recalled that the need for a gray scaling in direct write lithography comes from the situation that semiconductor industry design rules imply smaller and smaller address grids in order to match the specifications with respect to image placement and line edge roughness. For example, using a geometric spot size of 25 nm with about 22.5 nm blur and an address grid with 25 nm pitch, simulations show that 46 gray levels are sufficient to place the features with the required precision of 1 nm on the wafer (meaning a line-position error below 0.5 nm and a line-width error below 0.5 nm at all grid positions). Additionally, to meet lithography specifications the total line width variation has to be less than about 10% of the critical dimension (=nominal minimum line width), which means that the single side line edge roughness has to be less than 5% of line width. It is remarked that the line edge roughness is a measure for the linearity of lines, expressed by the deviation of a straight line of the level curve of the total dose distribution at the exposed wafer (aerial image) after cutting off at the threshold dose.

The main advantages of the interlocking-grid gray pixels are the following:

1) enhanced placement precision at same number of gray levels,
2) significant reduction of required gray level number for a given address grid,
3) reduction of gray level number allows further reduction of the size of the PD field,
4) writing of most critical lines (resolution<node) possible at same scanning speed,
5) for a given blur (percentage of minimum feature size) a smaller lithographic node can be achieved,
6) for a limited number of total apertures in the blanking aperture plate, as the case for low diameter columns, the number of apertures per level (=redundancy) is higher for interlocking grids as for a conventional grids, as illustrated by the example of 16.2 mm rectangular plate where 90 apertures can be subdivided into 2×16 gray levels (3 apertures per level) using interlocking grids or 46 gray levels (2 apertures per level) without interlocking grids, respectively.

Figure 18:
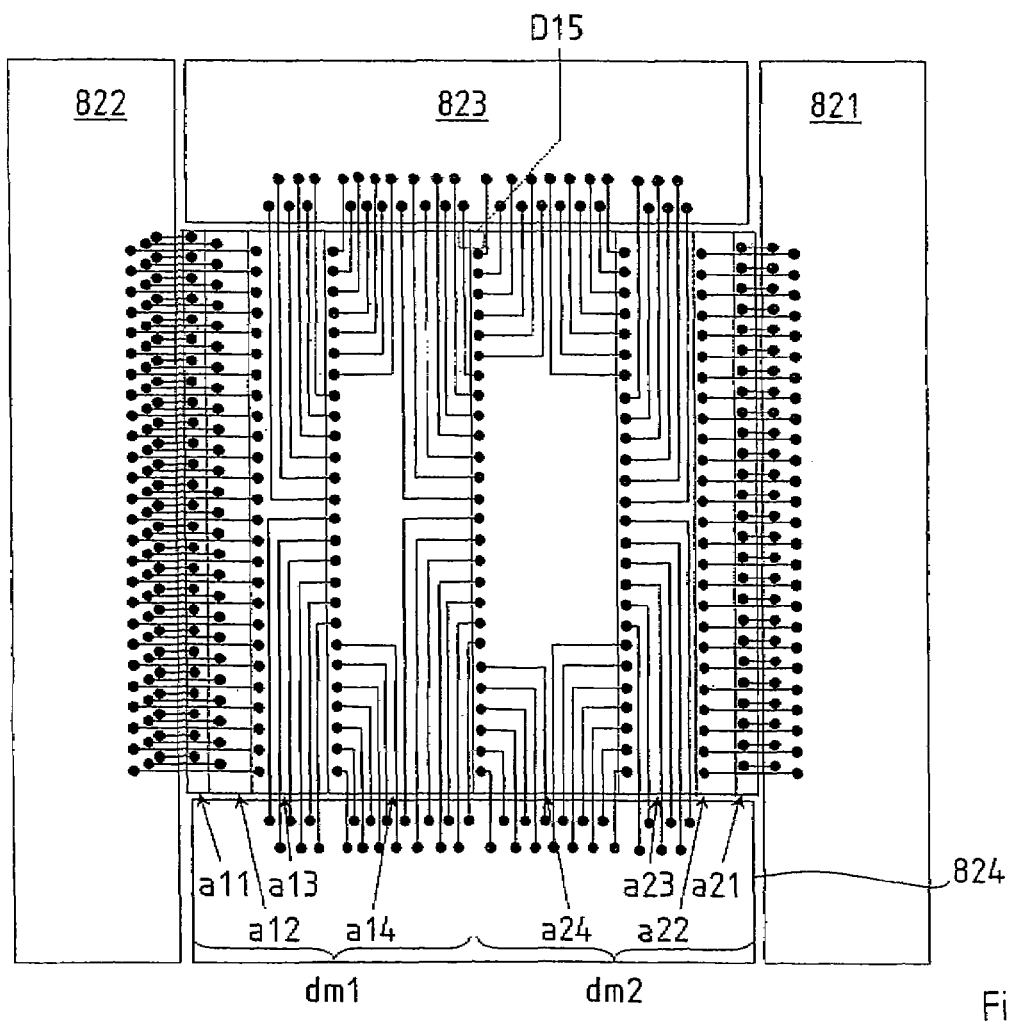
FIG. 18 a layout of a blanking plate with interlocking-grid domains.

FIG. 18 shows a PD field implementing gray groups with interlocking grids, in a view like that of FIG. 8. Converter means 821 . . . 824 surround a PD field in which gray groups of blanking openings are realized, and the gray groups are organized again (like in FIG. 8) into stripes a11, a12, a13, a14, a21, a22, a23, a24 which span the width of the PD field across the scanning direction. In this case, however, the first four stripes a11 . . . a14 belong to a first domain dm1, while the other four stripes a21 . . . a24 to a second domain dm2 realizing grids shifted by one half of the diagonal of the square that corresponds an aperture. Thus, the grids underlying the stripes a11 . . . a14 of the first domain dm1 are interlocking with those of the second domain dm2, as illustrated and discussed in detail above with reference to FIG. 17.

Thus, each domain dm1, dm2 comprises a plurality of staggered lines of blanking openings, wherein the lines of one domain are offset to the lines of the other domain by a fraction of the width of the lines, the apertures of each line of each domain representing at least one group. In the special case illustrated in FIG. 18, the two domains have corresponding partitions of groups, so each group of the first domain has a corresponding group of the second domain with equal number of blanking openings in the respective group. However, it is well possible that in a variant within the scope of the invention the number of apertures in one domain or the partition into groups is different from that used in another domain. It is expected that not a full implementation of groups for a second domain is needed in every case, but primarily groups such as to realize intermediate intensities as appropriate for a forming a fine spatial resolution on the target.

The arrangement of apertures of the PD device of FIG. 18 comprises 90×3240 apertures in an arrangement according to n=6 and m=6 (n×m=36). The pixel size illuminated on the wafer (pixel width x in FIG. 3) is 25 nm according to a 200× reduction optics and 5 μm apertures used for the embodiment shown. The number of apertures (blanking openings) in the gray groups of the stripes a11 . . . a14, a24 . . . a21 are (3, 6, 12, 24; 24, 12, 6, 3) from left to right in FIG. 18. For better clarity, aperture marks are not shown in FIG. 18. In other respects, the same considerations as with FIG. 8 apply to FIG. 18 as well.

Figure 19:
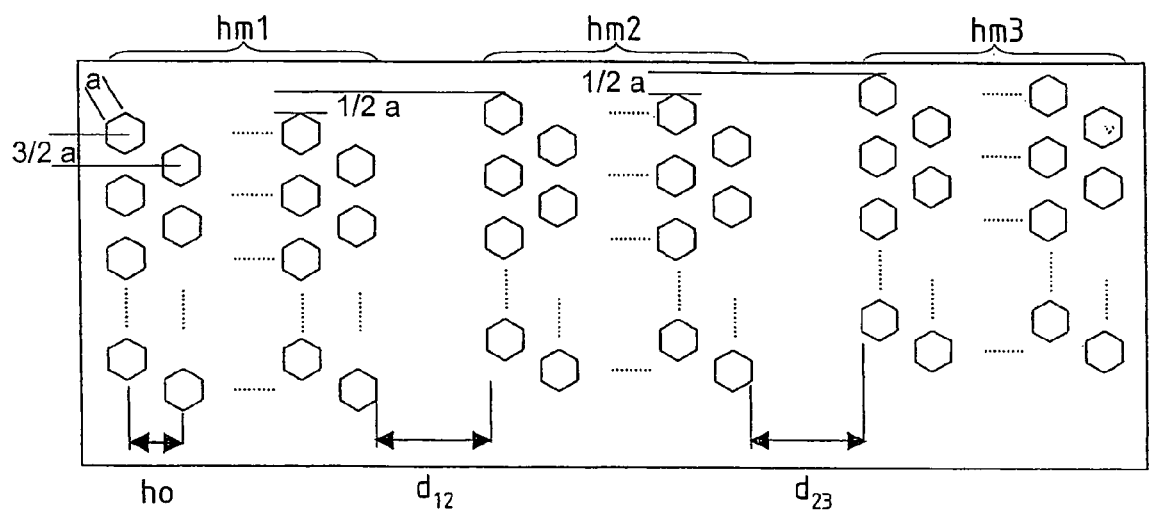
FIG. 19 an interlocking-grid arrangement with hexagonal arrays.
Figure 20:
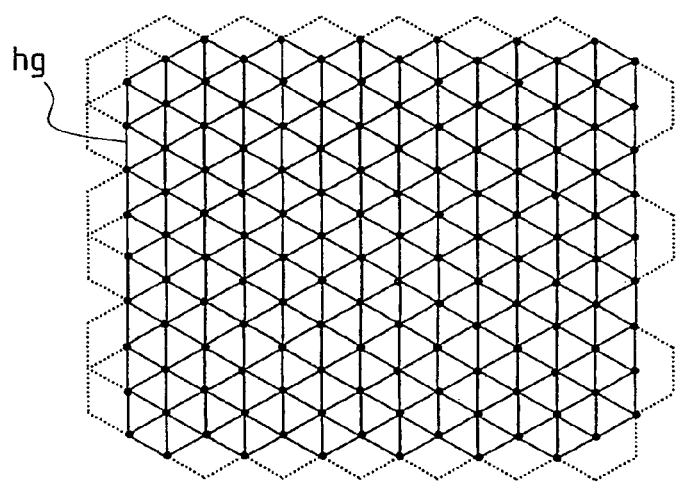
FIG. 20 the address grid on the target resulting from the interlocking hexagonal arrays of FIG. 19.

It is worthwhile to note that there are other ways to realize interlocking grids. One example is shown in FIGS. 19 and 20, namely, an arrangement of hexagonal apertures (or having a shape close to a hexagon, for example circular or a corner-rounded square) in the PD field (FIG. 19) for addressing a triangulated target grid (FIG. 20). The apertures (or blanking openings) are arranged in three domains hm1, hm2, hm3. Within each domain, which may be sub-partitioned in to gray groups according to the above considerations, the apertures are positioned with respect to each other according to an hexagonal array (which may be elongated in the direction of scanning), where neighboring lines are spaced apart by 3/2 of the side length a of an hexagon, and a suitable value for the offset ho of apertures in neighboring lines is ho=(k+1/2)·a·√3, with k≧1 being an integer number. In general, any offset is possible if an appropriate signal phase transformation is provided for the offset lines. The distance between the apertures of different domains, $d_{12}$ and $d_{23}$, may be chosen as equal to the offset ho, or as (k'+1/2)·a·√3, or in general, any offset if an appropriate signal phase transformation is applied to the respective first aperture of the groups belonging to the respective domain. The distances $d_{12}$, $d_{23}$ will usually be equal to each other, but could also take different values. With these values, the hexagonal apertures of FIG. 19 are appropriate for generating a regular distribution according to a triangulated target grid hg shown in FIG. 20. In this figure, the dots represent the physical access grid on the target (centers of exposure dots), and the solid lines show the envelope of the geometric spots of the apertures of all three domains hm1 . . . hm3.

The particular advantages of interlocking grids for lithography e-beam direct write applications result from the following considerations:

For high voltage electron beam lithography, which is suitable to achieve highest resolutions in lithography, in particular when 100 keV electrons are used, an unwanted dose contribution (proximity effect) is caused by electron backscattering from the wafer (i.e., the target). 100 keV backscattered electrons are typically spread out substantially to dimensions of about 30 μm before reaching the resist covered surface. Forward scattering, for comparison, which is dominant at low energies, causes only a minor contribution. To correct for the proximity effect caused by 100 keV electrons, the problem can be turned into one of a smooth background dose correction and is practically independent of the particular feature shape.

For example, backscattering of 100 keV electrons in silicon gives rise to an extra dose of about 14% of the deposited dose (over 30 μm averaged) in the resist if maximum 50% pattern density is assumed. For very low pattern densities, for example in case of isolated lines with no patterns in the neighborhood, backscattering plays no significant role for the total dose.

The effective strategy for proximity correction made possible by the invention is an adjustment of the edge slope and cut-off position of the total dose distribution (=deposited dose plus extra dose due to backscattering) by using interlocking-grid gray level spots with adequate gray levels, yielding the as-designed edge positions at optimized edge slope over the entire address grid.

The described method of interlocking grids allows a very fine address grid (line position, line width) where all features can be realized with practically the same process latitude. In the case of zero background but also in presence of 14% background it is possible to adjust the edge slope of the deposited energy profile and the cut-off position, allowing process latitudes of sufficient quantity over the entire grid independent of the local pattern density.

For common high-contrast resist materials the resolution and process latitude can be derived from the aerial image (spatial distribution of deposited dose). As common for chemically amplified resists, the latent image (i.e. the spatial distribution of exposed and unexposed resist) is proportional to the exponential of the negative intensity of the aerial image. The resulting gamma-like behavior leads to the common (and good) approximation that the feature width and position after the lithographical process can be derived by "cutting off" the aerial image at a certain dose level, usually one half of the maximum dose level. In the examples shown in the following, the dose distribution is cut off at 50% of the average dose level, giving the reader an impression on the achievable width and position of lines after development, using the new possibilities offered by the invention.

Figure 23A:
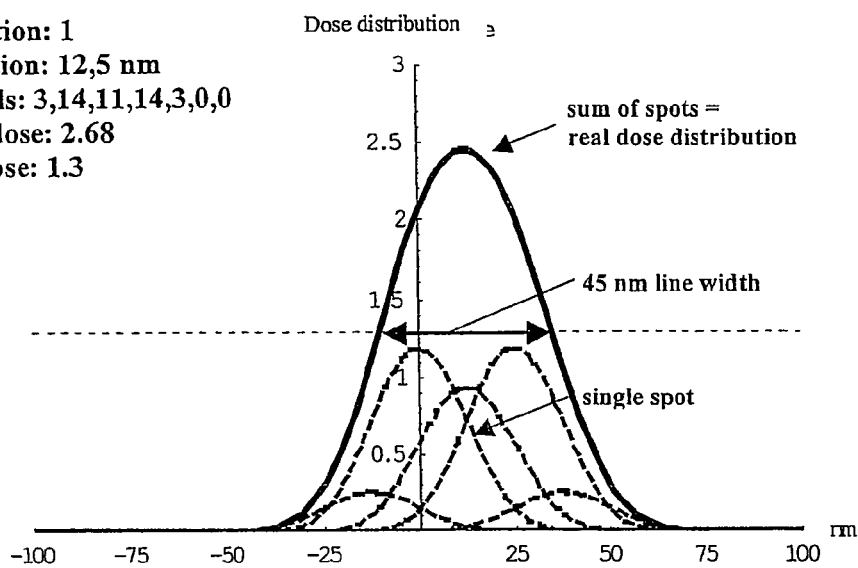
FIGS. 23a-f dose distributions along the cross sections of 45 nm lines produced by the interlocking-grid PD device of FIG. 18.
Figure 23B:
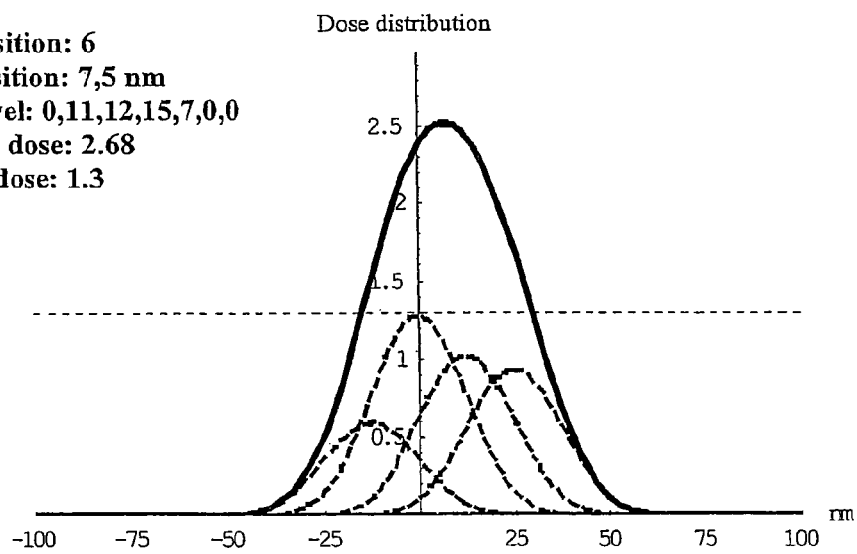
Figure 23C:
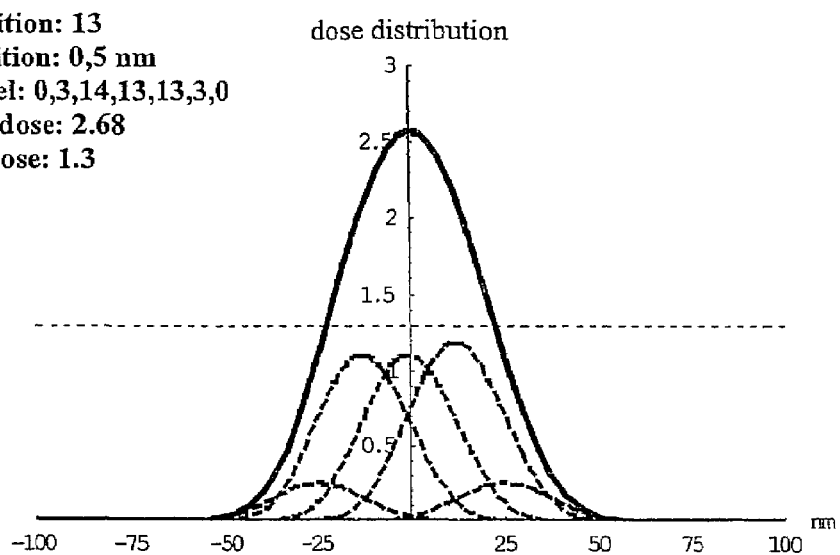
Figure 23D:
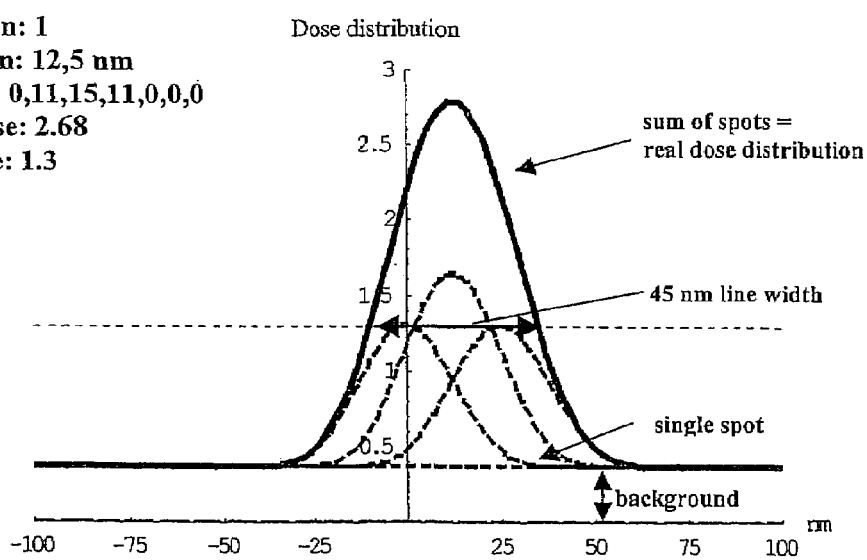
Figure 23E:
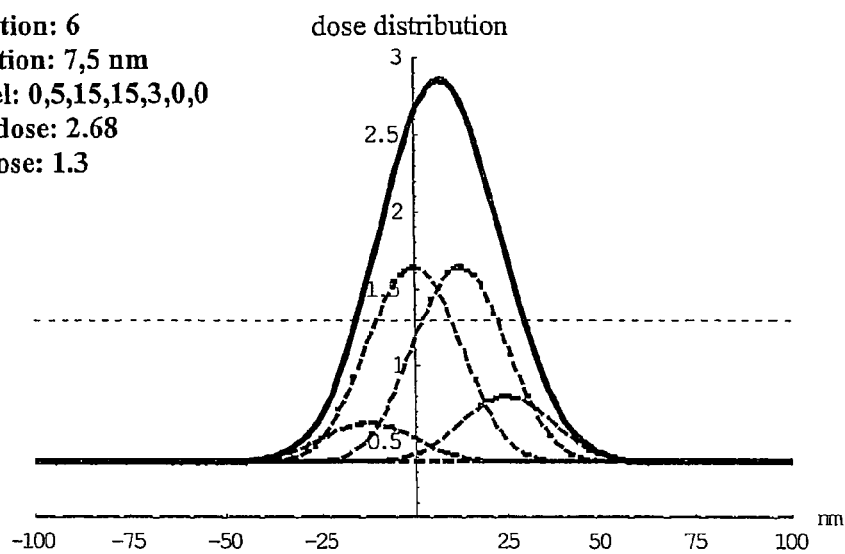
Figure 23F:
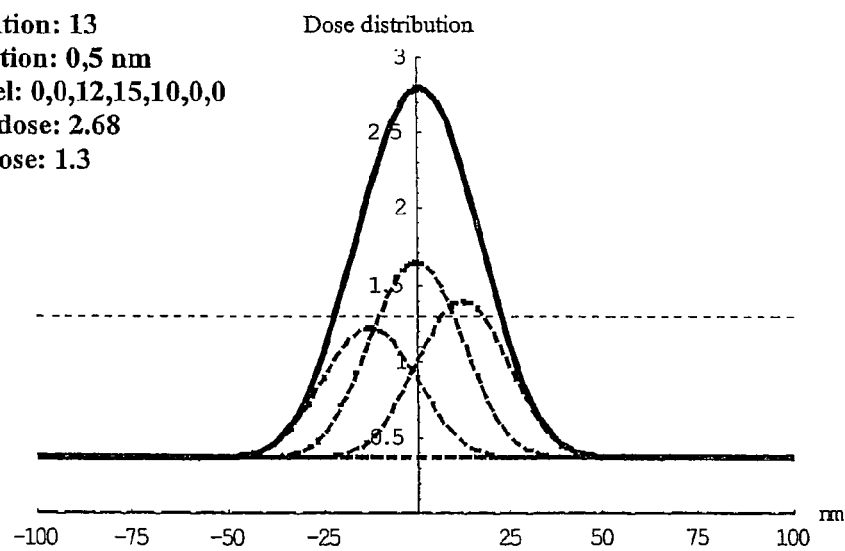

For illustration, simulated dose distributions (aerial image) for line features imaged on the target for three arbitrarily selected grid positions are shown in FIGS. 23a-c for zero background, and in FIGS. 23d-f for 14% background, assuming interlocking grids as in the above example are used. In the FIGS. 23 and 24 the solid lines represent the total doses, and the dashed lines represent the contributions of the individual gray pixels (Gaussian shape) to the respective total doses along the cross sections of the lines (the lines assumed to be long enough so that the ends of lines do not contribute to the sections). To illustrate the worst case of proximity effect related background, all curves are shifted by 14% of the total dose per area upwards is FIG. 23d-f (as the case for 50% pattern density and 28% dose contribution due to backscattering). Obviously, between 0% and 14% background similar behavior is found.

Figure 24A:
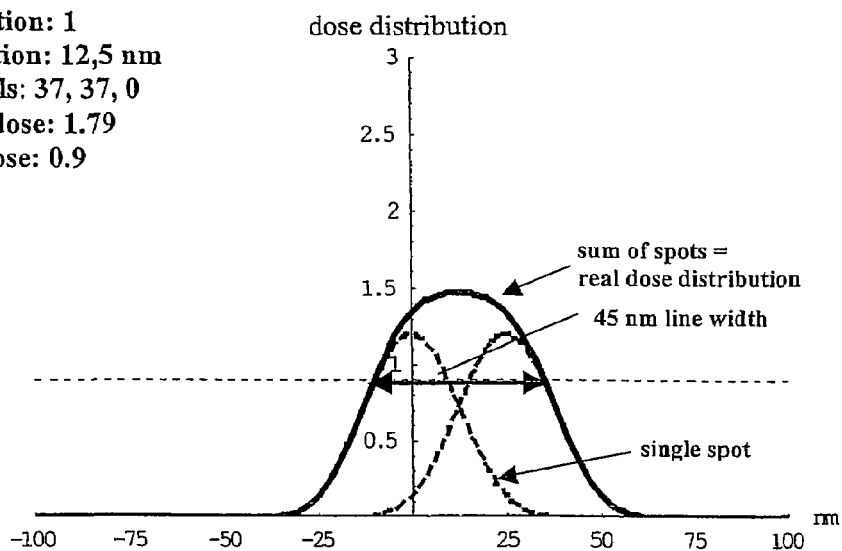
FIGS. 24a-f dose distributions along the cross sections of 45 nm lines produced by the PD device of FIG. 8 (no interlocking grids)
Figure 24B:
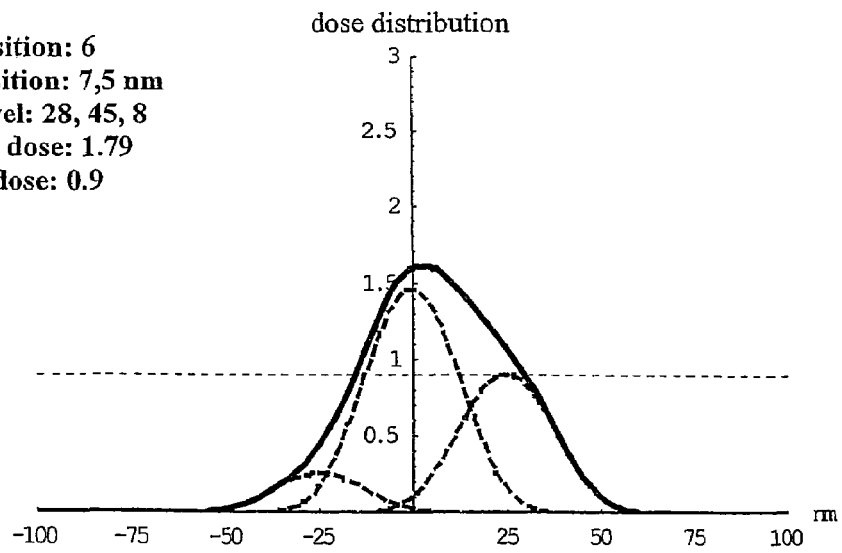
Figure 24C:
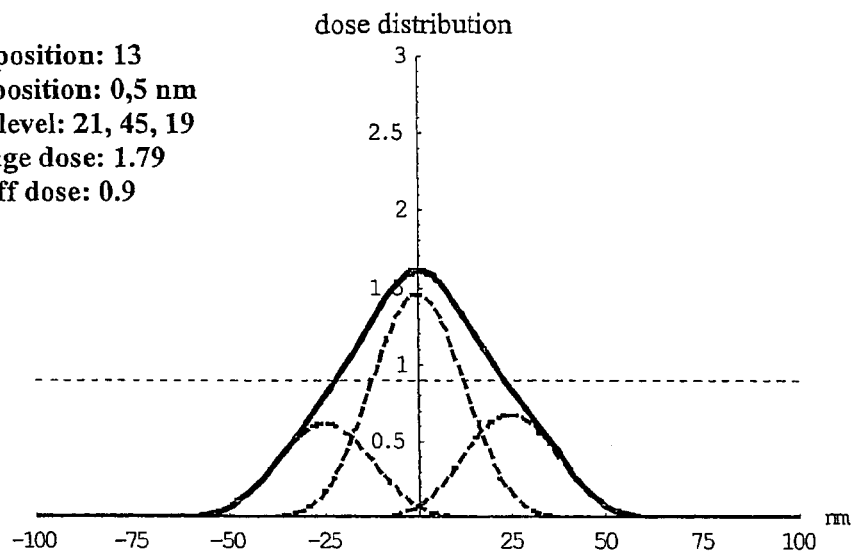
Figure 24D:
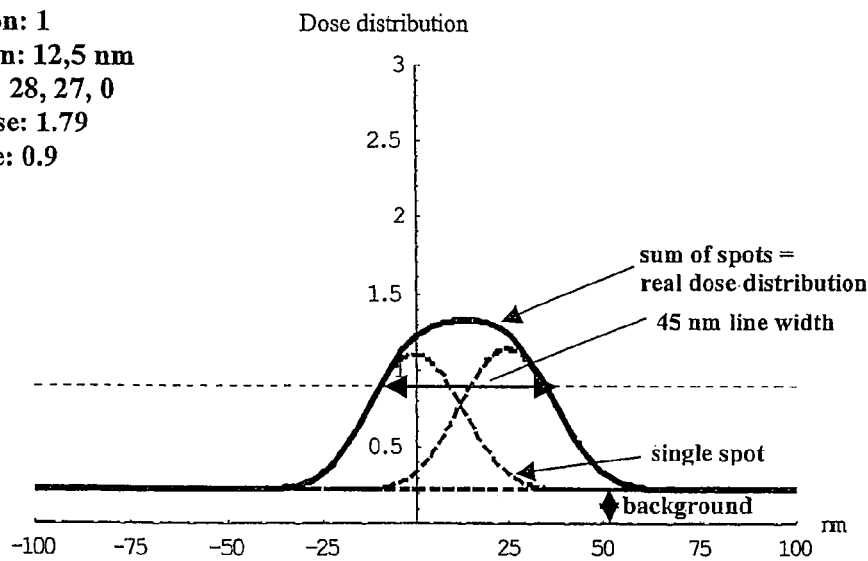
Figure 24E:
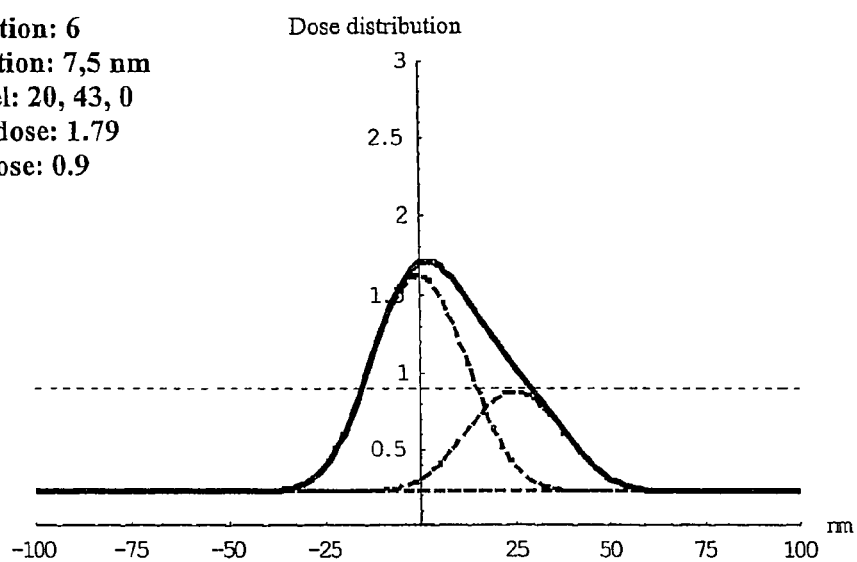
Figure 24F:
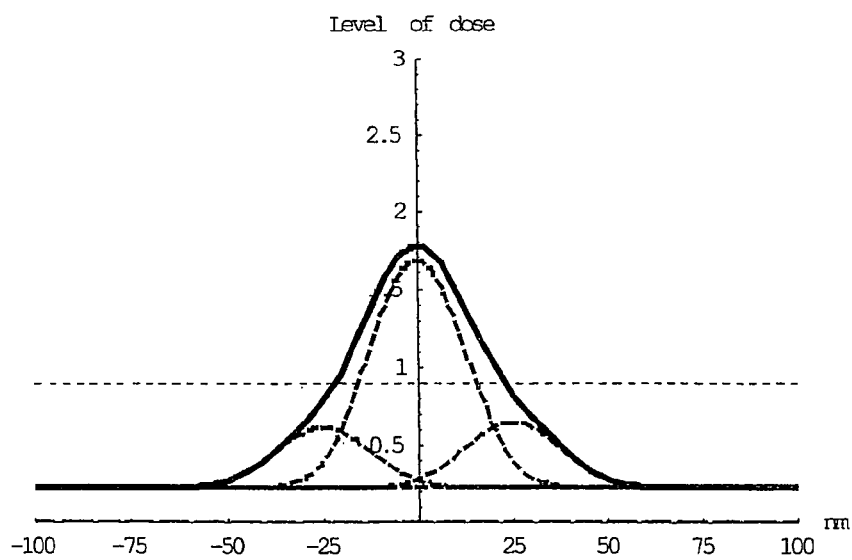

For comparison, without interlocking grids the use of 46 or even more gray levels (instead of 16+16 for two domains) does not nearly allow such a fine slope angle adjustment, as revealed in the simulations of FIGS. 24a-c at zero background and FIGS. 24d-f at 14% background. Essentially, interlocking grids are needed to achieve both slope angle adjustment and line placement control simultaneously, particularly if a precision of less than 1 nm is required. The overall fine adjustment of the edge slope and cut-off position, as evident in FIGS. 23a-f, is enabled by the possibility to control the dose distributions inside the overlapping regions.

One quantitative expression for the process latitude (or dose latitude), applied in the following, would be the dose window that causes a change of the nominal line width from 90% to 110%. Typical values of the process latitude are around 15% if the blur is one half of the minimum feature size. Calculations made by the applicants showed that, using interlocking-grid gray pixels according to the invention, the process latitude can be kept above 14.5% for all grid positions and variable background from 0% up to 14% (corresponds to 0-50% pattern density), whereas without interlocking grids there is an obvious variation of the process latitude with the grid position by a factor of almost 2. As an example the process latitude achievable for the 45 nm node is given for interlocking grids in FIG. 25a, and without interlocking grids in FIG. 25b.

Figure 25A:
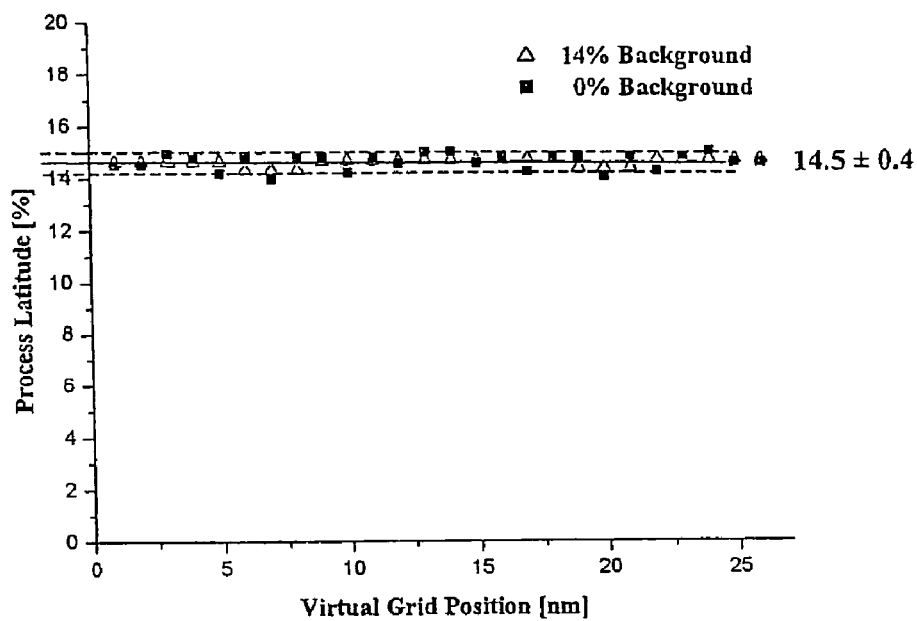
FIG. 25 process latitudes as obtained using a PD device with (FIG. 25a) or without (FIG. 25b) interlocking grids.
Figure 25B:
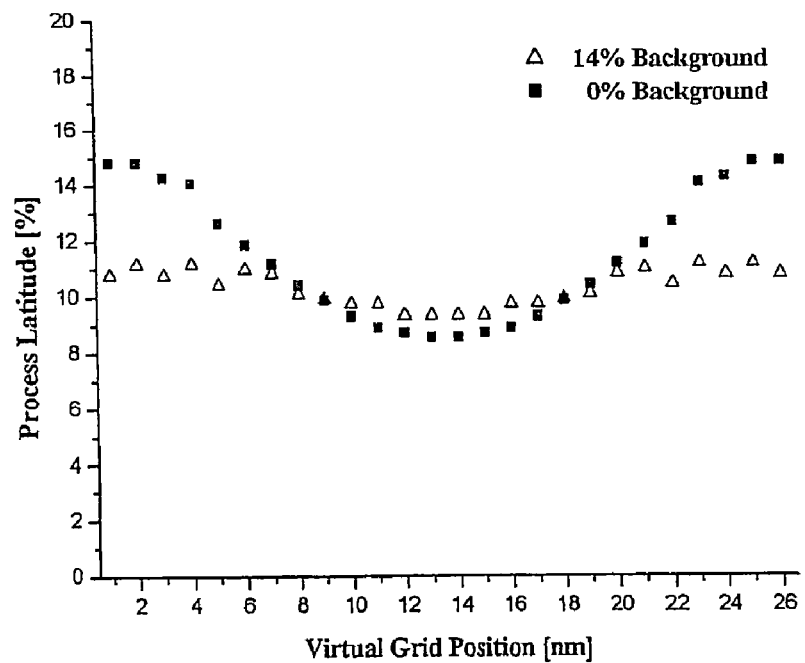

As mentioned previously, the overall number of apertures in the PD field (or gray levels) can be reduced by using interlocking grids according to the invention, as shown for example by the improvement of the dose latitude in FIG. 25a as compared to FIG. 25b, where the minimum number of apertures of all gray groups is 1+2+4+8+8+4+2+1=30 apertures for 2 domains with 16 levels each, as compared with one domain with 45 apertures with 45 levels. Consequently, the invention enables the use of optical columns having lower beam diameters, with less apertures in line. Small diameter columns can be used to realize a multi-column approach with the advantage to enhance the wafer throughput and reduce stage parameters.

The possibility to realize process latitudes that are independent of feature shapes and pattern density is one major advantage of the invention with regard to semiconductor manufacturing industry. In practice, the lithographic contrast, and hence the yield of an exposure is closely connected to the process latitude, which is a measure for the process-related critical dimension variation if the exposure dose is varied with respect to the nominal exposure dose. Any dependence of the process latitude on the grid position would mean a reduction of the usable process latitude, as the whole wafer has to be processed under the same conditions. In prior art, the proximity correction within a scanning stripe exposure strategy was unavoidably connected with a reduction of the overall process latitude, even if a larger number of gray levels are used.

Certainly, besides backward scattering also the correction of forward scattering can, in principle, be achieved by the use of interlocking grid spots. The procedure is straight forward.

Another important advantage of using interlocking grids is that the level curves of the spatial dose distribution after cutting off at the threshold level are very smooth, so that the resulting line edge roughness is very small. A comparison of the line edge roughnesses (single side) between with and without using interlocking grids (as simulated by the authors) is shown in Table 1 displayed at the end of this disclosure. For the case without interlocking grids the maximum value of single side line edge roughness is 4.32% of the line width for a line at a 45° angle with respect to the grid, which means that the lithography requirements, namely that the total line width variation has to be less than 10% of the line width, can be hardly met in that case. In general, the line edge roughness gets additional contributions from the resist process and the shot noise, both to be included within the allowed 10%. Using the same PD with interlocking grids according to the invention, for example, even at 32 nm resolution the line edge roughness remains sufficiently small, with a simulated maximum of 1,88% at 20° angle with respect to the grid.

Figure 26A:
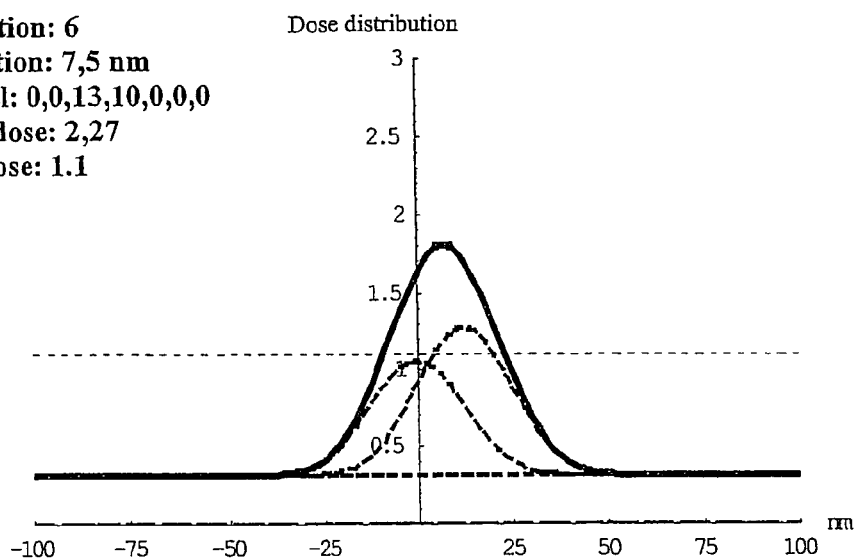
FIGS. 26a and 26b dose distributions along the cross sections lines of reduced width (32 nm) produced using interlocking grids.
Figure 26B:
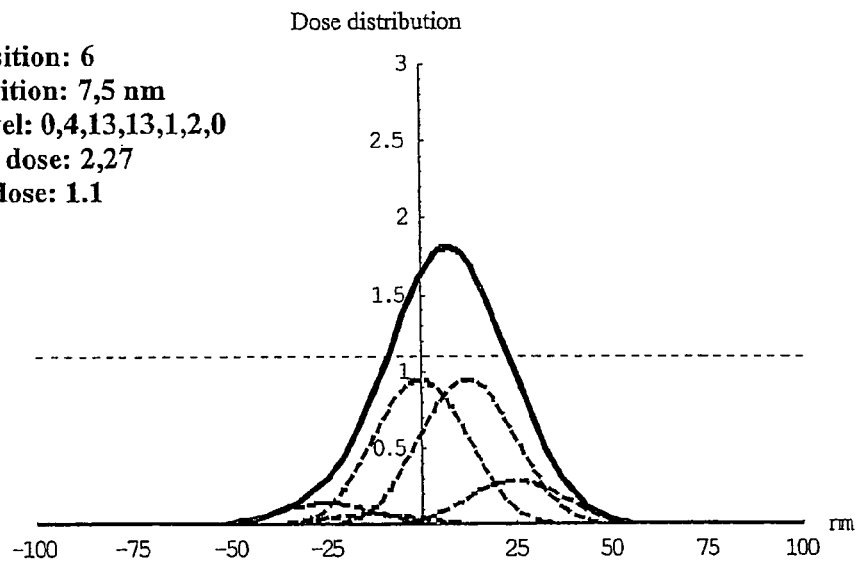
Figure 27:
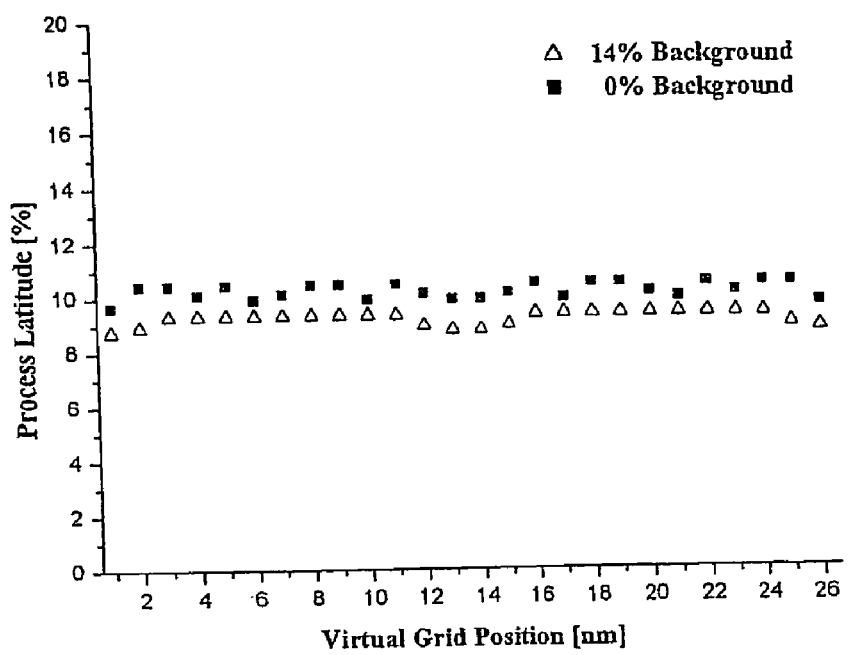
FIG. 27 process latitude relating to pixels of reduced width (32 nm) as in FIG. 26.

Finally, FIGS. 26a, 26b and 27 show that accepting a reduced absolute value of the process latitude, the use of interlocking grids allows to generate also 32 nm lines at the same 22.5 nm blur used in FIGS. 23 and 24, again for variable background doses between 0% and 14%. Since also here the process latitude can be adjusted to be independent of the line position, and the line-center and line-width errors are less than 0.5 nm over the whole 1 nm address grid (according to simulations which used 16 levels per domain), the same PD device can be used in principle also for the 32 nm lines and spaces resolution. This means that interlocking grids allow to go to resolutions far below the limitation given by the imaging blur without interlocking grids, and reach e.g. 32 nm features with a blur of 70% of the feature size.

The invention obviously helps to circumvent fabrication limits in the PD device, and enables a better exploitation of the imaging system with respect to the ultimate resolution. For the 45 nm node at low pattern density, where no significant background is present, it is possible to increase the dose latitude of 32 nm line to the same value as for 45 nm line. This possibility can be used for example to write critical lines of reduced width (32 nm line) in a 45 nm lithography process, for example the gate lengths of transistors.

It is worthwhile to point out that the principle of interlocking grids can be used for any kind of pattern generation in which a pattern is composed by gray pixels, in particular (but not restricted to) focused ion beam or electron beam direct writing applications. Another alternative application of the invention is, for example, the use of interlocking grids in optical mask-less lithography, where a light or X-ray beam is structured by means of an addressable mirror plate and directed onto a substrate.

In summary, the main advantages of interlocking grids are:

Lower number of gray levels needed: One of the main improvements is a reduction of the physical address grid (i.e. the distance of neighboring exposure spots) which is possible during a single scanning stripe exposure process. This is achieved by arranging the available number of apertures in an adequate way over the PD field and addressing parts of the apertures by data streams adequately transformed (with interpolated pixel information). The corresponding address grid and process latitude is significantly improved despite a lower number of gray levels for each exposure spot, as the physical address grid is doubled. For example, using exposure spots of 25 nm width with interlocking-grid spots at 12.5 nm distance (in X and Y direction) and 16 gray levels for each spot, a 1 nm address grid (error of center of line <0.5 μm, error of width of line <0.5 nm) can be realized with excellent dose latitude of 14.6% process latitude. For comparison, without an interlocking grid even 64 gray levels per exposure spot would not satisfy a comparably low process latitude, as the process latitude is varied with the grid position by a factor of 2.

Proximity correction possible: Another advantage is related to the possibility to adjust the slope angles and slope positions within a wide range by overlaying several exposure spots, so that a proximity effect related background does neither lead to a change in the dose latitude nor reduces the line position and line width achievable over a very small address grid.

Enhanced resolution: A third advantage is based on the possibility to significantly improve the image contrast by creating features with higher slope angles. This leads to an effective enhancement of the image resolution for a given aberration blur. For example, using 5 μm apertures and 200× reduction, the corresponding exposure spots allow an image line resolution of 32 nm, again with a high process latitude on a 1 nm address grid.

Figure 21:
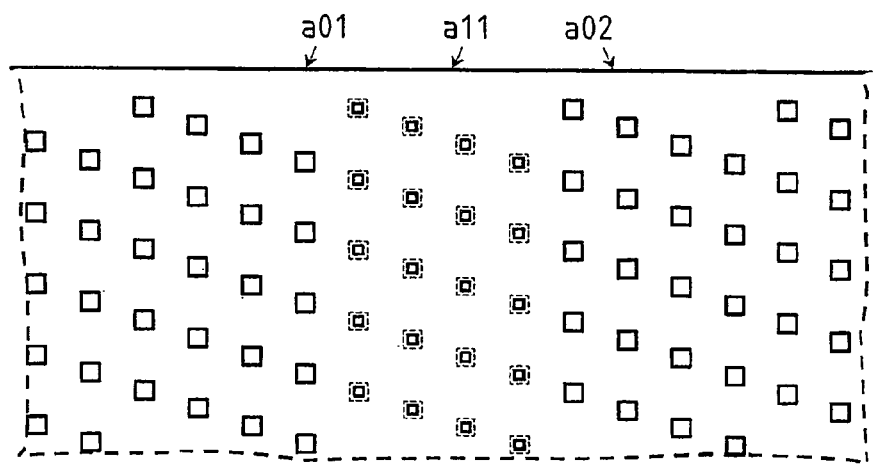
FIG. 21 an arrangement of apertures with varying widths.

Another possible way to address a finer grid of target pixels is illustrated in FIG. 21. An arrangement with different sizes of apertures for different groups may be used to increase the resolution or intensity contribution of particular channels. The apertures of the groups of the stripe a11 are smaller than the width of the lines, while the apertures in the groups belonging to the other stripes a01 and a02 correspond to the width of the lines ("standard size"). Of course, also combinations of the aforementioned variants are to be taken into account, including various shapes of apertures.

TABLE 1

Line edge roughness 2 × 16 vs. 46 gray levels (22.5 nm blur)

| | Single side line edge roughness of aerial image (%) | | | |
|---|---|---|---|---|
| | 2 × 16 gray levels circular spots 25 nm | | 46 gray levels circular spots 27 nm | |
| Line angle (degree) | Line width 45 nm | Line width 32 nm | Line width 45 nm | Line width 32 nm |
| 0° | 0.44 | 0.73 | 0.98 | 1 nm address grid not achievable |
| 5° | 0.55 | 1.56 | 1.76 | |
| 10° | 0.61 | 1.86 | 0.94 | |
| 15° | 0.55 | 1.81 | 1.20 | |
| 20° | 0.26 | 1.88 | 1.60 | |
| 25° | 0.67 | 1.10 | 2.62 | |
| 30° | 0.73 | 1.40 | 2.60 | |
| 35° | 0.67 | 0.93 | 3.28 | |
| 40° | 0.62 | 1.14 | 4.32 | |
| 45° | 0.55 | 0.66 | 3.80 | |

I claim:

1. A pattern definition device for use in a particle-beam exposure apparatus, said device being adapted to be irradiated with a beam of electrically charged particles and pass the beam through a plurality of apertures defining the shape of beamlets passing though said apertures, wherein the apertures are arranged within a pattern definition field comprising a plurality of lines of apertures, wherein the apertures are spaced apart along said lines of apertures by a first integer multiple of the width of an aperture and are offset between neighboring lines of apertures by a fraction of said integer multiple of the width, wherein said apertures are associated with corresponding blanking openings arranged along lines of blanking openings, wherein each blanking opening is associated with a deflector controllable by a blanking signal such that said deflector is switchable between a first deflection state in which particles passing through said blanking opening are allowed to travel along a path and a second deflection state in which particles passing through said blanking opening are deflected off said path, and wherein for the lines of blanking openings, the blanking openings of a line of blanking openings are partitioned into multiple groups such that the deflectors of the blanking openings of each group are fed a common group blanking signal, wherein the group blanking signal of each group of a line of blanking openings is controlled independently of the group blanking signals of the other groups of the same line of blanking openings.

2. The device of claim 1, comprising an aperture plate for forming said beamlets and a blanking plate for controlling the passage of selected beamlets.

3. The device of claim 1, wherein the groups have at least two different sizes with regard to the numbers of blanking openings in the respective groups.

4. The device of claim 3, wherein the numbers of blanking openings in the groups correspond to powers of two multiplied with a uniform base number.

5. The device of claim 3, wherein the numbers of blanking openings in all groups except one group correspond to powers of two multiplied with a uniform base number.

6. The device of claim 3, wherein the number of all groups in a line is smaller than 16 and the size of the largest group with regard to the respective number of blanking openings is at least four times the size of the smallest group.

7. The device of claim 1, wherein the partitioning of blanking openings into groups is the same for all lines.

8. The device of claim 7, wherein corresponding groups of the lines of blanking openings are positioned adjacent to each other, forming stripes arranged perpendicular to the orientation of the lines of blanking openings.

9. The device of claim 7, wherein the partition of blanking openings into groups is the same for all lines of blanking openings, but with at least two different sequences of the groups within the respective lines of blanking openings.

10. The device of claim 1, wherein the pattern definition field is divided perpendicularly to the orientation of lines of blanking openings into at least two domains, each domain being composed of a plurality of staggered lines of blanking openings, wherein the lines of one domain are offset to the lines of the next domain by a fraction of the width of the lines, the apertures of each line of each domain representing at least one group.

11. The device of claim 10 wherein the pattern definition field is divided into two domains, wherein each group of the first domain has a corresponding group of the second domain with equal number of blanking openings in the respective group, wherein the lines of the second domain are offset to the lines of the first domain by a fraction of the width of the lines.

12. The device of claim 1, wherein the blanking signal is applied to the individual blanking openings through time delay circuitry for generating a time delay of said signal corresponding to the offsets of the respective blanking openings along the line.

13. The device of claim 1, wherein the width of the apertures is equal to the width of the lines.

14. The device of claim 1, wherein the width of the apertures associated with selected groups of blanking openings have a width smaller than the width of the lines, the remaining apertures having a width equal to the width of the lines.

15. The device of claim 1, wherein the group blanking signals are fed to the pattern definition field partly at a side running parallel to the orientation of lines, partly at a side running perpendicular.

16. The device of claim 1, wherein the shape of the apertures is substantially equivalent to a two-dimensional geometrical base shape of a contiguous covering of the plane.

17. The device of claim 16, wherein the base shape is a square.

18. The device of claim 1, wherein a group comprises at least one blanking opening for which the line feeding the group blanking signal to said blanking opening(s) comprises a component which is accessible on a surface of the device by a structural modification and which is adapted to change its transmissivity for the group blanking signal between a electrical connecting state and a blocking state upon treatment by said structural modification.

19. The device of claim 18, wherein the component is realized as a conductor segment adapted to be irreversibly modified between an electrical well-conducting and a non-conducting state.

20. The device of claim 1, wherein the deflection means are adapted to deflect, in the switched off state, the particles to an absorbing surface of said exposure apparatus mounted after the device as seen in the direction of the particle beam.

21. The device of claim 16, wherein the shape of the apertures is equivalent to a two-dimensional polygonal base shape of a contiguous covering of the plane, with rounded and/or beveled edges.

22. The device of claim 21, wherein the area of the shape of the apertures is the same as that of the original polygonal base shape.

23. The device of claim 21, wherein the shape of the apertures is a corner-rounded square.

24. A charged particle beam exposure apparatus, comprising:

a charged particle source for generating a beam of charged particles; and an aperture plate comprising a plurality of openings and a plurality of deflectors, each deflector being associated with a corresponding opening, wherein each is controllable by a signal so as to be switchable between a first state and a second state, wherein, in said first state, a given deflector allows particles of the beam of charged particles to pass through a corresponding opening along a predetermined path and wherein, in said second state, the given deflector deflects particles of the beam of charged particles away from the predetermined path;

wherein the plurality of openings are arranged in plural groups such that each group comprises multiple openings, and wherein the openings of a given group are electrically connected with each other so as to be commonly controlled by said signal.

25. The charged particle beam exposure apparatus of claim 24, wherein at least two groups of openings have a different number of openings.

26. The charged particle beam exposure apparatus of claim 25, wherein the number of openings of each of the at least two groups corresponds to a power of two multiplied with a common integer number.

27. The charged particle beam exposure apparatus of claim 25, wherein the number of openings of all except one groups corresponds to a power of two multiplied with a common integer number.

28. The charged particle beam exposure apparatus of claim 24, wherein the openings of each group are disposed directly adjacent to each other.

29. The charged particle beam exposure apparatus of claim 24, wherein pairs of openings of each group are electrically connected by electrical delay elements.

30. The charged particle beam exposure apparatus of claim 29, wherein the electrical delay element is configured to generate the signal to control the deflection electrode of an opening.

31. The charged particle beam exposure apparatus of claim 24, further comprising an absorbing surface disposed such that the particles of the beam of charged particles passing through an opening and deflected away from the predetermined path are incident on the absorbing surface.

32. The charged particle beam exposure apparatus of claim 24, further comprising a wafer stage for mounting a wafer thereon, and charged particle optics configured to direct the particles of the beam of charged particles passing through an opening and along the predetermined path onto a wafer mounted on the wafer stage.

33. The charged particle beam exposure apparatus of claim 24, wherein each deflector comprises a deflection electrode.

* * * * *